US010032785B2

(12) United States Patent
Kitajima

(10) Patent No.: US 10,032,785 B2
(45) Date of Patent: Jul. 24, 2018

(54) SEMICONDUCTOR DEVICE AND METHOD OF MANUFACTURING SEMICONDUCTOR DEVICE

(71) Applicant: Renesas Electronics Corporation, Tokyo (JP)

(72) Inventor: Hiroyasu Kitajima, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/248,457

(22) Filed: Aug. 26, 2016

(65) Prior Publication Data

US 2017/0062448 A1    Mar. 2, 2017

(30) Foreign Application Priority Data

Aug. 28, 2015 (JP) ................................. 2015-169487

(51) Int. Cl.
| | |
|---|---|
| *H01L 29/788* | (2006.01) |
| *H01L 27/11524* | (2017.01) |
| *H01L 29/423* | (2006.01) |
| *H01L 21/28* | (2006.01) |
| *H01L 29/66* | (2006.01) |
| *H01L 21/3213* | (2006.01) |
| *H01L 21/768* | (2006.01) |

(52) U.S. Cl.
CPC .. *H01L 27/11524* (2013.01); *H01L 21/28273* (2013.01); *H01L 21/32133* (2013.01); *H01L 21/76895* (2013.01); *H01L 29/42328* (2013.01); *H01L 29/66553* (2013.01)

(58) Field of Classification Search
CPC ......... H01L 27/11524; H01L 21/28273; H01L 21/32133; H01L 21/76895; H01L 23/535; H01L 29/42328; H01L 29/66553; H01L 29/66825; H01L 29/788
See application file for complete search history.

(56) References Cited

U.S. PATENT DOCUMENTS

| | | | |
|---|---|---|---|
| 2008/0242026 A1 | 10/2008 | Matsuzaki et al. | |
| 2011/0037114 A1* | 2/2011 | Tsujita | H01L 21/28273 257/316 |
| 2014/0115230 A1* | 4/2014 | Yang | H01L 27/11524 711/103 |

FOREIGN PATENT DOCUMENTS

JP     2008-251825 A    10/2008

* cited by examiner

*Primary Examiner* — Sitaramarao S Yechuri
(74) *Attorney, Agent, or Firm* — Sughrue Mion, PLLC

(57) ABSTRACT

A pair of floating gates disposed to be spaced apart from each other by a first distance and a pair of spacer insulating films disposed on each of the pair of floating gates are provided in a memory region. Also, a pair of floating gates disposed to be spaced apart from each other by a second distance and a pair of spacer insulating films disposed on each of the pair of floating gates are provided in a monitor region. Then, the second distance is smaller than the first distance. Thus, by narrowing a distance between the floating gates in the monitor region, a tapered portion can be provided on a side surface portion of the floating gate in the monitor region. Then, by checking this tapered portion, it is possible to understand the shape of the floating gate in the memory region.

10 Claims, 31 Drawing Sheets

SEMICONDUCTOR DEVICE AND METHOD OF MANUFACTURING SEMICONDUCTOR DEVICE

CROSS-REFERENCE TO RELATED APPLICATION

The present application claims priority from Japanese Patent Application No. 2015-169487 filed on Aug. 28, 2015, the content of which is hereby incorporated by reference into this application.

TECHNICAL FIELD OF THE INVENTION

The present invention relates to a semiconductor device and a method of manufacturing the semiconductor device and for example, relates to a semiconductor device including a floating gate and a method of manufacturing the same.

BACKGROUND OF THE INVENTION

As a semiconductor device (non-volatile semiconductor memory device) capable of retaining stored data even after a power source is turned off, a semiconductor device including a floating gate has been known. Such a semiconductor device can write and erase stored date by accumulating and discharging electric charges into and from the floating gate.

For example, Japanese Patent Application Laid-Open Publication No. 2008-251825 (Patent Document 1) discloses a non-volatile semiconductor memory device including a floating gate and an NSG spacer formed thereon.

SUMMARY OF THE INVENTION

The inventor of the present invention has been engaged in the research and development of the non-volatile semiconductor memory device described above and has conducted a study on improvement of the characteristics thereof and a method of evaluating its characteristics. Specifically, a spacer formed on a floating gate serves as a mask when a conductive film for the floating gate is processed. Thus, since the floating gate hides itself under the spacer, it is difficult to check the form of the floating gate.

This floating gate is apart for accumulating and discharging electric charges and an important portion which gets deeply involved in the characteristics of writing and erasing stored data, and accordingly, constant monitoring of the form of the floating gate has been desired.

The above and other preferred aims and novel characteristics of the present invention will be apparent from the description of the present specification and the accompanying drawings.

The typical ones of the inventions disclosed in the present application will be briefly described as follows.

A semiconductor device indicated in an embodiment disclosed in the present application includes a pair of floating gates disposed to be spaced apart from each other by a first distance, and a pair of spacer insulating films disposed on each of the pair of floating gates, in a memory region. Also, the semiconductor device includes a pair of floating gates disposed to be spaced apart from each other by a second distance, and a pair of spacer insulating films disposed on each of the pair of floating gates, in a monitor region. Then, the second distance is smaller than the first distance.

A method of manufacturing a semiconductor device indicated in an embodiment disclosed in the present application includes the step of etching a conductive film of a lower layer using a pair of spacer insulating films disposed to be spaced apart from each other by a first distance in a memory region and a pair of spacer insulating films disposed to be spaced apart from each other by a second distance in a monitor region as a mask. Accordingly, a pair of floating gates is formed in the memory region, and a pair of floating gates is formed in the monitor region. Then, the second distance is smaller than the first distance.

According to the semiconductor device indicated in typical ones of the embodiments disclosed in the present application, the characteristics of the semiconductor device can be improved.

According to the method of manufacturing a semiconductor device indicated in typical ones of the embodiments disclosed in the present application, the semiconductor device having favorable characteristics can be manufactured.

BRIEF DESCRIPTIONS OF THE DRAWINGS

DESCRIPTIONS OF THE PREFERRED EMBODIMENTS

Figure 1:
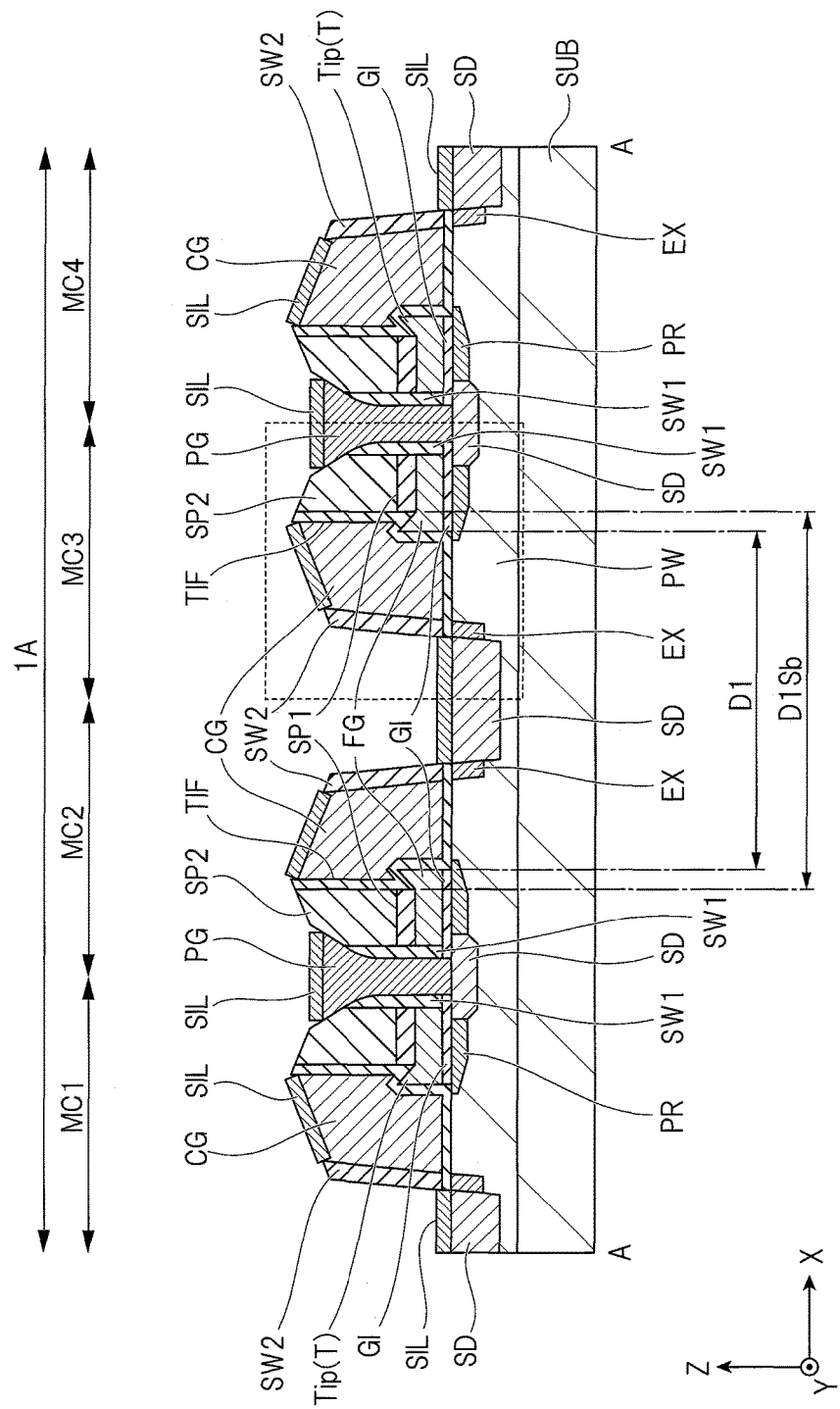
FIG. 1 is a cross-sectional view of a memory region of a semiconductor device according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value (including number of pieces, values, amount, range, and the like) and the like described above.

Hereinafter, embodiments of the present invention will be described in detail with reference to the accompanying drawings. Note that, in all the drawings for describing the embodiments, members having the same function are denoted by the same or related reference characters, and the repeated descriptions thereof will be omitted. When a plurality of similar members (portions) are present, a symbol is added to a reference character of a collective term to indicate an individual or specific portion, in some cases. Also, the description of the same or similar parts will not be repeated in principle unless particularly required in the following embodiments.

Also, in some drawings used in the embodiments, hatching is omitted even in a cross-sectional view so as to make the drawings easy to see. Also, hatching is used even in a plan view so as to make the drawings easy to see.

In cross-sectional views and plan views, a size of each portion does not correspond to that of an actual device, and a specific portion is shown relatively largely so as to make the drawings easy to see, in some cases. Even when a plan view corresponds to a cross-sectional view, a specific portion is shown relatively largely so as to make the drawings easy to see, in some cases.

First Embodiment

In the following, a structure of a semiconductor device according to the present embodiment will be described with reference to the drawings. The semiconductor device according to the present embodiment is a non-volatile semiconductor memory device including a floating gate.

[Description of Structure]

The semiconductor device according to the present embodiment includes a memory region 1A in which a memory cell having a floating gate is formed, and a monitor region 2A in which a monitor pattern having a floating gate is formed.

In the following, the structure of the semiconductor device including the memory cell and the monitor pattern will be described, and the monitor pattern has the same configuration as the memory cell, except for the configuration of the floating gate. That is, the monitor pattern is constituted by respective component portions which are made of the same layer as those of the memory cell, that is, constituted by the respective component portions which are formed of the same materials and formed in the same processes as those of the memory cell. For this reason, in the configuration of the monitor pattern, parts corresponding to the configuration of the memory cell are denoted by the same characters as the memory cell, and only different part (floating gate) will be described in detail.

Figure 2:
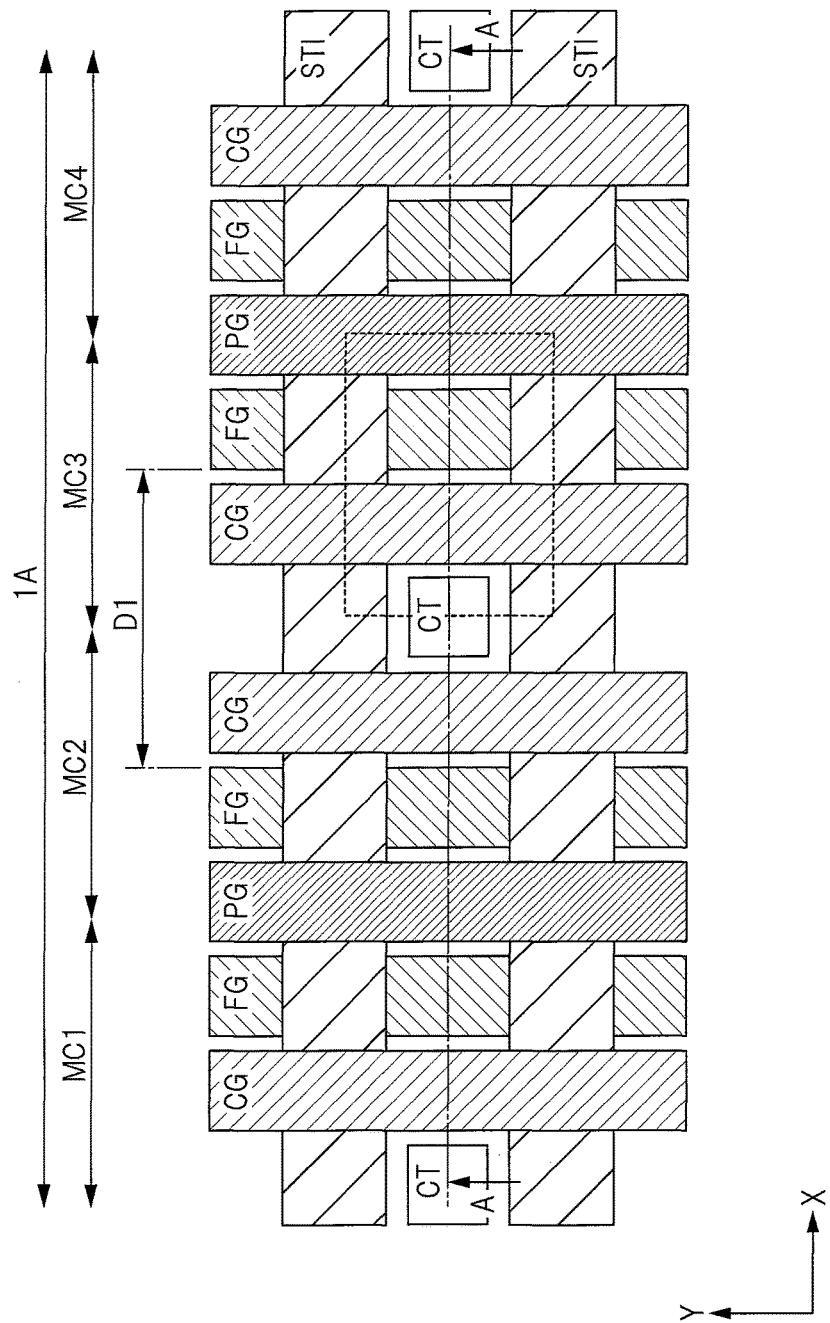
FIG. 2 is a plan view of the memory region of the semiconductor device according to the first embodiment.
Figure 3:
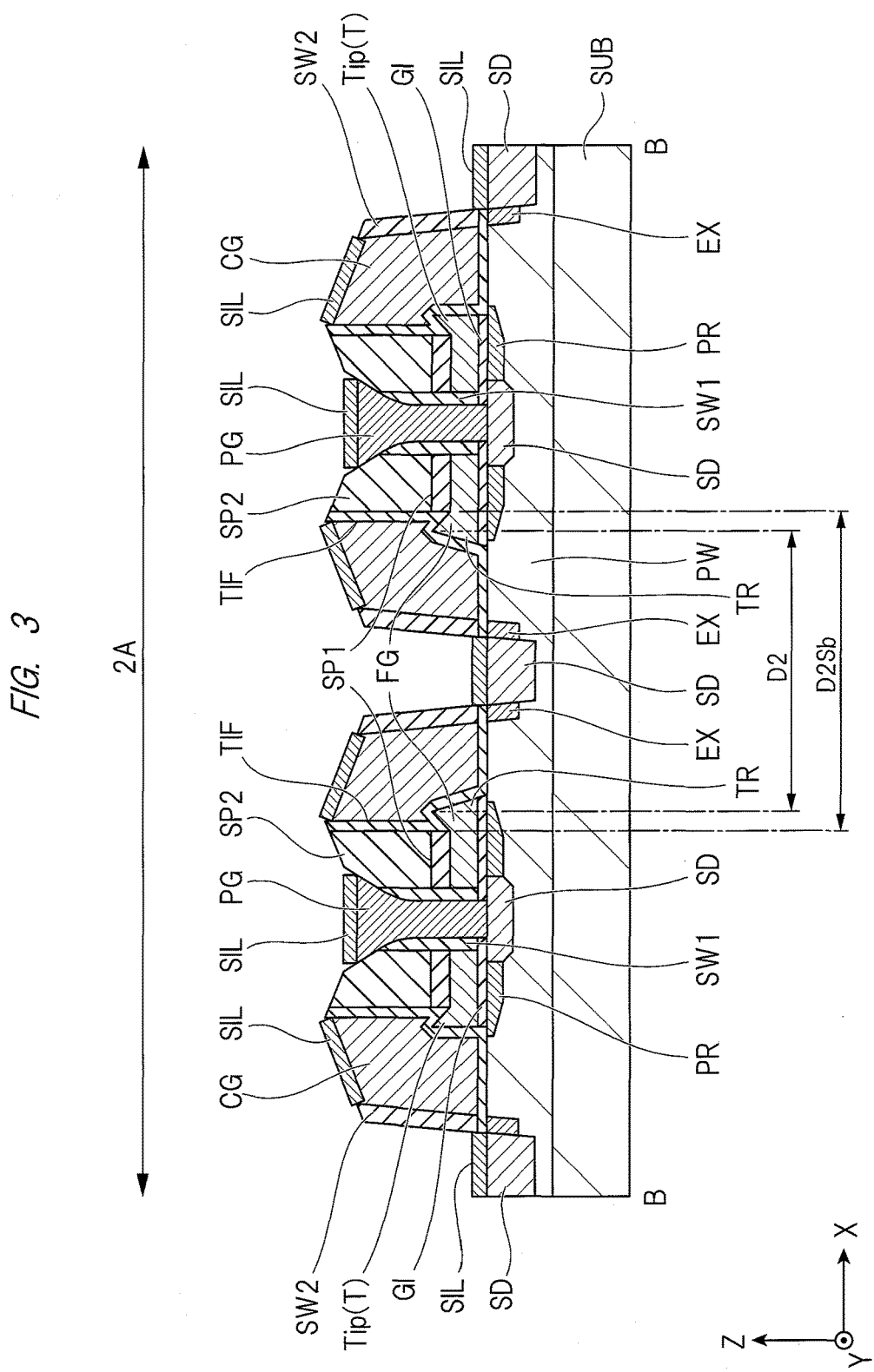
FIG. 3 is a cross-sectional view of the monitor region of the semiconductor device according to the first embodiment.
Figure 4:
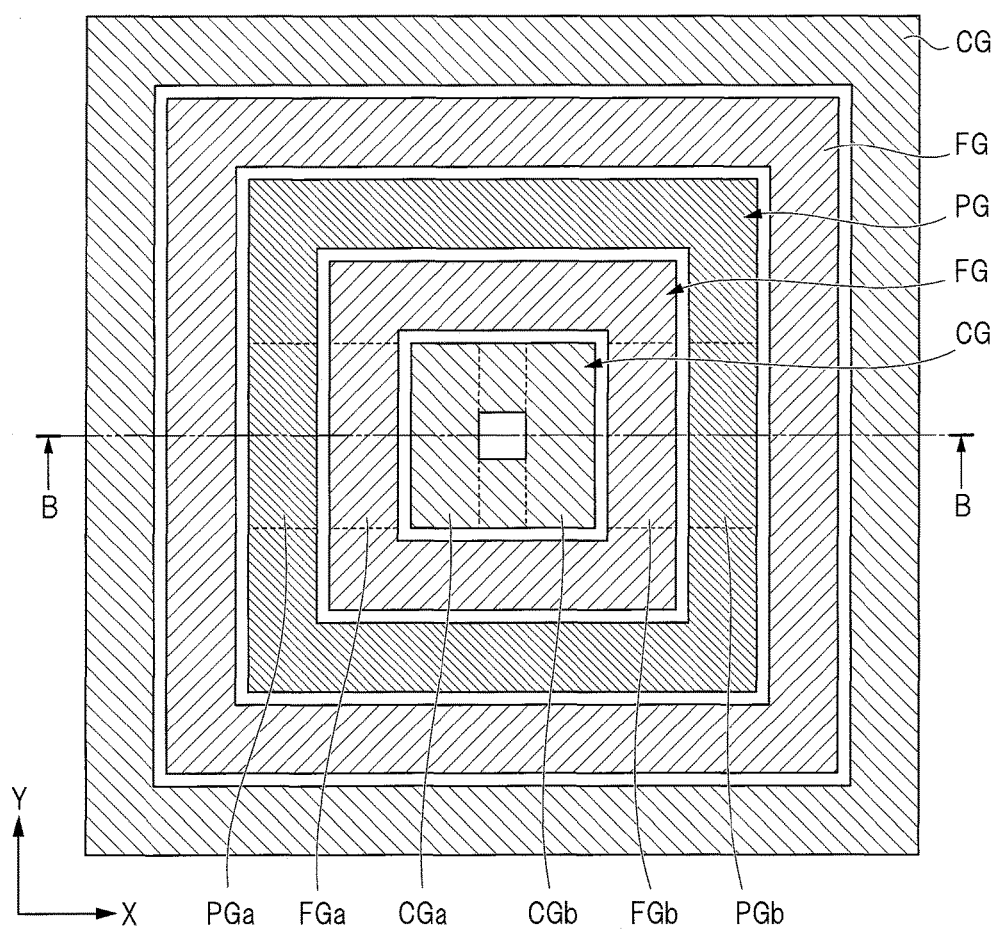
FIG. 4 is a plan view of the monitor region of the semiconductor device according to the first embodiment.

FIG. 1 is a cross-sectional view of the memory region of the semiconductor device according to the present embodiment, FIG. 2 is a plan view of the memory region of the semiconductor device according to the present embodiment, FIG. 3 is a cross-sectional view of the monitor region of the semiconductor device according to the present embodiment, and FIG. 4 is a plan view of the monitor region of the semiconductor device according to the present embodiment. For example, FIG. 1 corresponds to a cross-sectional view taken along a line A-A in FIG. 2, and FIG. 3 corresponds to a cross-sectional view taken along a line B-B in FIG. 4.

In FIG. 1, four memory cells are illustrated. The four memory cells in FIG. 1 are denoted by MC1, MC2, MC3, and MC4, from the left. For example, one-bit data can be stored in a section (one memory cell or 1 Cell) surrounded by a dotted line. Each component portion of the memory cell MC3 surrounded by the dotted line and each component portion of the memory cell MC 4 are symmetrically disposed with respect to a plug (conductive plug) PG. Then, each component portion of these two memory cells (MC3 and MC4) and each component portion of the two memory cells (MC1 and MC2) are symmetrically disposed with respect to a source and drain region SD in the center of FIG. 1. Thus, the memory cell is repeatedly disposed with respect to the plug PG or the source and drain region SD between control gates CG.

Next, each component portion of the memory cells will be described with reference to the memory cell MC3 surrounded by the dotted line in FIG. 1.

As illustrated in FIG. 1, one memory cell (MC3) includes a control gate CG disposed above a semiconductor substrate SUB (p-type well PW) and a floating gate FG which is disposed above the semiconductor substrate SUB (p-type well PW) and adjacent to the control gate CG. For example, the control gate CG and the floating gate FG are made of a silicon film, respectively. An upper portion on a side surface of the floating gate FG is sharpened. In other words, a sharp-edged portion (tip portion) Tip is provided in the vicinity of the upper portion (at an upper corner portion) on the side surface of the floating gate FG. The shape of the sharp-edged portion Tip will be described in detail in paragraphs of a manufacturing process described later. In addition, a metal silicide film SIL is formed on an upper portion of the control gate CG. Moreover, a spacer (spacer insulating film) SP1 and another spacer (spacer insulating film) SP2 disposed thereon are disposed on the floating gate FG. In other words, a laminate film including the spacer SP1 and the spacer SP2 is disposed on the floating gate FG. The laminate film including the spacer SP1 and the spacer SP2 is in a sidewall shape. Note that the laminate film including the spacer SP1 and the spacer SP2 may be referred to as a spacer insulating film (SP1 and SP2), in some cases.

The memory cell further includes a gate insulating film GI disposed between the floating gate FG and the semiconductor substrate SUB (p-type well PW). The gate insulating film GI is, for example, made of a silicon oxide film. In addition, the memory cell further includes a tunnel insulating film TIF disposed between the floating gate FG and the control gate CG. The tunnel insulating film TIF is, for example, made of a silicon oxide film. This tunnel insulating film TIF is disposed also between the spacer insulating film (SP1 and SP2) on the floating gate FG and the control gate CG and also between the control gate CG and the semiconductor substrate SUB (p-type well PW). That is, the tunnel insulating film TIF is disposed in such a way that it passes through between a side surface of the spacer insulating film (SP1 and SP2) and a side surface of the control gate CG and between the side surface of the floating gate FG and the side surface of the control gate CG, and extends between a bottom surface of the control gate CG and the semiconductor substrate SUB (p-type well PW).

The memory cell further includes sidewall insulating films (sidewall or sidewall spacer) SW1 and SW2 which are disposed on sidewalls of a combined pattern of the floating gate FG and the control gate CG and made of an insulating film. In addition, the memory cell further includes the source and drain regions SD disposed in the semiconductor substrate SUB (p-type well PW) on both sides of the combined pattern of the floating gate FG and the control gate CG. In other words, one source and drain region SD is disposed on the side of the control gate CG, and the other source and drain region SD is disposed on the side of the floating gate FG. The source and drain region SD is, for example, an $n^+$-type semiconductor region.

The source and drain region SD disposed on the side of the control gate CG is of a so-called lightly doped drain (LDD) type. Accordingly, low concentration semiconductor regions ($n^-$-type semiconductor region) EX are disposed at the ends of the source and drain region ($n^+$-type semiconductor region or high concentration semiconductor region) SD. In other words, the low concentration semiconductor regions ($n^-$-type semiconductor region) EX are disposed in the semiconductor substrate SUB (p-type well PW) below the respective sidewall insulating films SW2.

The plug PG is disposed on the source and drain region SD disposed on the side of the floating gate FG. In addition, the metal silicide film SIL is formed on the plug PG.

Note that a p-type semiconductor region PR is disposed in the semiconductor substrate SUB (p-type well PW) below the floating gate FG herein.

The spacer insulating film (SP1 and SP2) and the tunnel insulating film TIF are disposed between the plug PG and the control gate CG. In this manner, by interposing the spacer insulating film (SP1 and SP2) between the plug PG and the control gate CG, it is possible to insulate the plug PG from the control gate CG. Specifically, even when the metal silicide film SIL is formed on each of the plug PG and the control gate CG, it is possible to prevent short-circuiting between the metal silicide films SIL.

As described above, the memory cell is repeatedly disposed with respect to the plug PG (the source and drain region SD between floating gates FG) or the source and drain region SD between control gates CG. Next, a plan layout of each component portion of the memory cell will be described with reference to FIG. 2. FIG. 2 illustrates a plan layout of the four memory cell regions.

As illustrated in FIG. 2, the plug PG and the control gate CG which constitute the memory cell MC3 extend in a Y direction, respectively. The plug PG and the control gate CG each have a rectangular planar shape with long sides in the Y direction. The floating gate FG has a rectangular shape with long sides in the Y direction, and a plurality of floating gates FG are disposed in the Y direction via element isolation regions STI.

Then, the floating gate FG and the control gate CG which constitute the memory cell MC3 and are adjacent to each other, and the floating gate FG and the control gate CG which constitute the memory cell MC4 and are adjacent to each other, are disposed symmetrically with respect to the plug PG. Also, the plug PG, the floating gates FG, and the control gates CG which constitute the memory cells MC3 and MC4, and the plug PG, the floating gates FG, and the control gates CG which constitute the memory cells MC2 and MC1, are disposed symmetrically with respect to a contact plug CT. The contact plug CT is disposed on the source and drain region SD between the control gates CG.

In addition, as illustrated in FIG. 2, the element isolation regions STI which extend in an X direction across the plug PG extending in the Y direction are disposed. The element isolation region STI has a rectangular planar shape with long sides in the X direction (see FIG. 8). Also, the element isolation regions STI which extend in an X direction across the control gate CG extending in the Y direction are disposed. In other words, the plug PG and the control gates CG are disposed in the Y direction across the element isolation regions STI extending in the X direction, above the element isolation regions STI.

Moreover, when viewed differently, a pair of floating gates FG disposed to be spaced apart from each other by a distance D1, and a pair of control gates CG disposed inside the pair of floating gates FG (spaced portion with the distance D1) are disposed in the memory region. Then, outside the pair of floating gates FG, a pair of plugs PG is disposed. Note that the source and drain regions SD on the side of the floating gates FG are disposed below the pair of plugs PG, and the source and drain region SD on the side of the control gates CG is disposed below the pair of control gates CG. Further, a pair of spacer insulating films (SP1 and SP2) is disposed on the pair of floating gates FG.

As illustrated in FIG. 3, one monitor pattern has the same component portions as those of the memory cell. That is, the monitor pattern includes a control gate CG, a floating gate FG, a plug PG, a metal silicide film SIL, spacer insulating films SP1 and SP2, sidewall insulating films SW1 and SW2, a gate insulating film GI, a tunnel insulating film TIF, a source and drain region SD, a low concentration semiconductor region EX, and a p-type semiconductor region PR. Also, in the monitor region 2A of FIG. 3, the respective component portions are repeatedly disposed so as to correspond to four memory cells (1 Cell).

Here, as illustrated in FIGS. 1 and 3, a distance (distance D2) between the floating gates FG in the monitor region 2A is smaller than a distance (distance D1) between the floating gates FG in the memory region 1A.

Figure 5A:
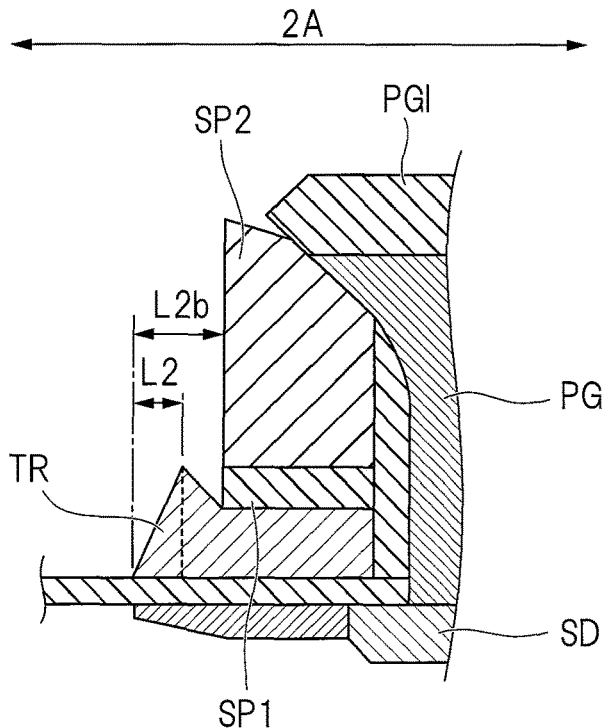
FIG. 5A is an enlarged view of the vicinity of a floating gate.
Figure 5B:
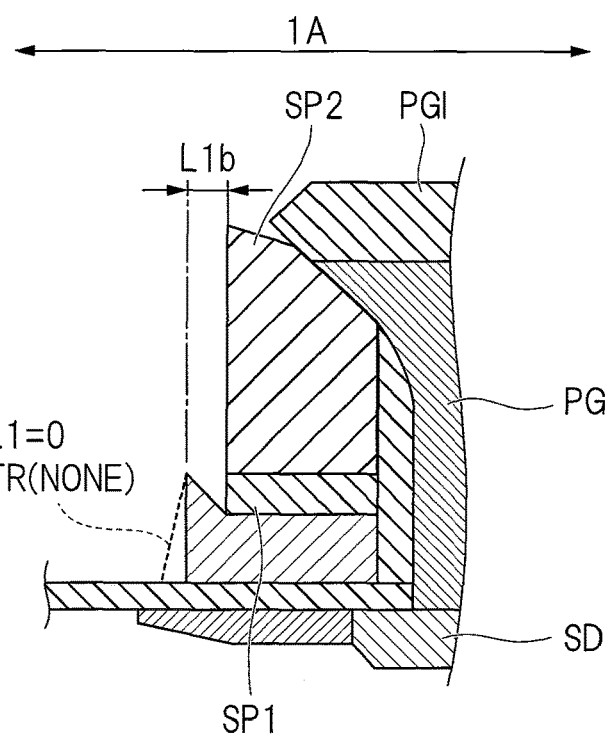
FIG. 5B is an enlarged view of the vicinity of the floating gate.

Then, the floating gate FG in the monitor region 2A has a part different from the floating gate FG in the memory region 1A in shape. More specifically, the floating gate FG in the monitor region 2A has a tapered portion TR on the side surface of the floating gate FG. FIGS. 5A and 5B are enlarged views of the vicinity of the floating gate FG. FIG. 5A is an enlarged view of the vicinity of the floating gate FG of the monitor pattern, and FIG. 5B is an enlarged view of the vicinity of the floating gate FG of the memory cell.

As illustrated in FIG. 5A, the tapered portion (protruding portion, tapered portion, or forward tapered portion) TR of the floating gate FG of the monitor pattern is a part protruding from the upper end of the side surface of the floating gate FG on the side of the control gate CG to the side of the control gate CG. Here, the tapered portion TR is formed only on one side of the floating gate FG of the monitor pattern. The side where the tapered portion TR is formed is the inside (spaced portion with a distance D2) of the pair of floating gates FG disposed to be spaced apart from each other by the distance D2.

Then, a length (protruding amount) L2 of this protruding part is larger than a length (protruding amount) L1 of the part protruding from the upper end of the side surface of the floating gate FG on the side of the control gate CG in the memory region 1A to the side of the control gate CG (L2>L1). Note that, in FIG. 5B, the protruding amount L1 is described as zero. That is, an example is illustrated in which the side surface of the floating gate FG of the memory cell on the side of the control gate CG is substantially vertical to the front surface of the substrate. Note that, as illustrated with a broken line in FIG. 5B, a tapered portion (protruding portion or tapered portion) may be formed on the side surface of the floating gate FG of the memory cell, in some cases.

Also, a length (protruding amount) L2b of the floating gate FG of the monitor pattern protruding from the end of the spacer insulating film (SP1 and SP2) is larger than a length (protruding amount) L1b of the floating gate FG of the memory cell protruding from the end of the spacer insulating film (SP1 and SP2) (L2b>L1b). Note that the part corresponding to the lengths L1b and L2b may be regarded as the tapered portion (protruding portion).

In this manner, the distance (distance D2) between the floating gates FG in the monitor region 2A is narrowed, so that the tapered portions TR can be provided on the side surfaces of the floating gates FG in the monitor region 2A. Then, by checking the tapered portions TR and the respective protruding amounts (L1, L2, L1b, and L2b), it is possible to understand the shape of the floating gate FG in the memory region 1A. The tapered portions TR and the respective protruding amounts (L1, L2, L1b, and L2b) will be described in further details in the paragraphs on the manufacturing processes described later.

Two floating gates FG are provided in the monitor region 2A, and the distance (distance D2) therebetween is set to be smaller than the distance (distance D1) between the floating gates FG in the memory region 1A. Accordingly, a plan layout of the monitor pattern is not limited, particularly as long as the two floating gates FG having a distance therebetween satisfying a relation that the distance D2 is at least smaller than the distance D1 are provided as one of the component portions of the monitor pattern, and an example of the plan layout of each component portion of the monitor pattern will be described with reference to FIG. 4.

For example, as illustrated in FIG. 4, the floating gate FG may be provided in a rectangular ring shape. Here, the outer shape of the floating gate FG is in a square shape, a width of the floating gate FG is the same as that in the memory region 1A, and the floating gate FG is provided in a ring shape. Then, for example, the floating gate FG has two floating gate portions FGa and FGb extending in the Y direction. A distance (distance D2) between these two floating gate portions FGa and FGb is smaller than a distance (distance D1) between the floating gates FG in the memory region 1A. That is, the relation that the distance D2 is smaller than D1 is satisfied. In this manner, the floating gate FG may be provided in a rectangular ring shape. By providing the floating gate FG in a rectangular ring shape, a micro-loading effect works in both of the X and Y directions, so that the tapered portion TR can be made larger.

Note that the plug PG, the floating gate FG, and the control gate CG are provided in a rectangular ring shape outside the floating gate FG in the monitor region 2A, in this order, with a predetermined interval. Also, the control gate CG is provided in a rectangular ring shape inside the inner floating gate FG in the monitor region 2A, with a predetermined interval.

Moreover, when viewed differently, a pair of floating gate portions (FGa and FGb) disposed to be spaced apart from each other by the distance D2 and a pair of control gate portions (CGa and CGb) disposed inside the floating gate portions (spaced portion with the distance D2) are disposed in the monitor region 2A. Then, a pair of plug portions (PGa and PGb) are disposed outside the pair of floating gate portions (FGa and FGb). Note that the source and drain regions SD on the sides of the floating gates FG are disposed below the plug portions (PGa and PGb), and the source and drain region SD on the side of the control gate CG is disposed below a region between the pair of control gate portions (CGa and CGb). Further, a pair of spacer insulating films (SP1 and SP2) is disposed on the pair of floating gate portions (FGa and FGb).

Figure 6:
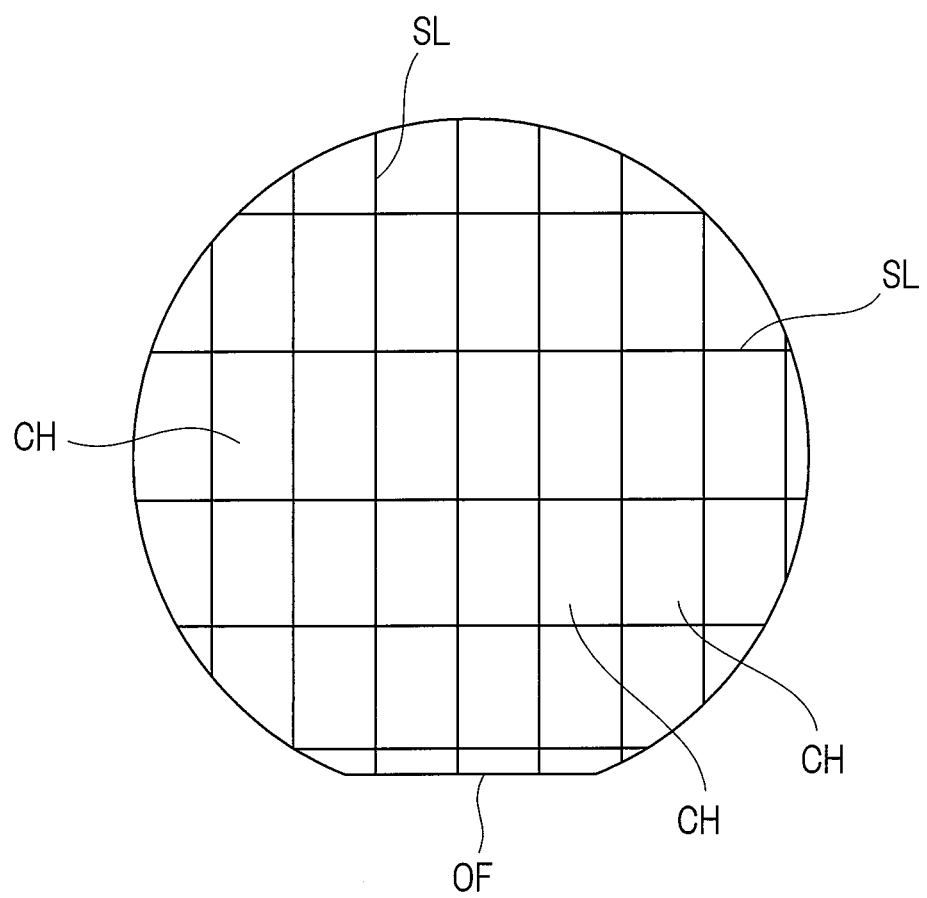
FIG. 6 is a top plan view of a wafer.

FIG. 6 is a top plan view of a wafer. The memory cell and the monitor pattern are formed in the wafer (semiconductor substrate SUB) illustrated in FIG. 6. As illustrated in FIG. 6, the wafer having a substantially disk shape is provided with a plurality of chip regions CH which are partitioned into a substantially rectangular shape. A region between the chip regions CH is referred to as a scribe line (scribe region) SL.

In such a wafer surface, a position in which the monitor region 2A and the memory region 1A are formed is not limited, and these regions (1A and 2A) may be formed in each chip region CH, for example. Alternatively, the memory region 1A may be formed in each chip region CH, and the monitor region 2A may be formed in the scribe line (scribe region) SL between the chip regions CH. Moreover, when a part of the chip regions CH is used as a test element group (TEG) region in which a plurality of test patterns are formed, the monitor region 2A may be formed in this TEG region.

[Description of Operation]

Next, an example of basic operation (driving method) of the memory cell will be described. As an operation of the memory cell, three operations such as (1) writing operation, (2) erasing operation, and (3) reading operation will be described. In this regard, however, definitions of these operations vary, and particularly, erasing operation and writing operation may be defined conversely, in some cases.

(1) Writing Operation

Writing operation is carried out by the source side channel hot electron (CHE: Channel Hot Electron) injection. In this case, the source and drain region SD on the side of the floating gate FG functions as a drain, and the source and drain region SD on the side of the control gate CG functions as a source, respectively. For example, voltages of +1.6 V, +7.6 V, and +0.3 V are applied to the control gate CG, the source and drain region on the side of the floating gate FG, and the source and drain region SD on the side of the control gate CG, respectively. Electrons discharged from the source and drain region SD on the side of the control gate CG are accelerated by a strong electric field in the channel region to be channel hot electrons CHE. Specifically, an electric potential of the floating gate FG also becomes high due to capacitive coupling of the source and drain region on the side of the floating gate FG with the floating gate FG, and a strong electric field is generated in the narrow gap between the control gate CG and the floating gate FG. High-energy channel hot electrons CHE generated by the strong electric field are injected into the floating gate FG through the gate insulating film GI. Such an injection is referred to as a source side injection (SSI: Source Side Injection). The SSI improves electron injection efficiency, thereby enabling low setting of applied voltage. By the injection of the electrons into the floating gate FG, the threshold voltage of the memory cell increases.

(2) Erasing Operation

Erasing operation is carried out by the Fowler Nordheim (FN) tunneling method, for example. For example, a voltage of +12.0 V is applied to the control gate CG. Then, the source and drain region SD on the side of the floating gate FG, the source and drain region SD on the side of the control gate CG, and the semiconductor substrate SUB (p-type well PW) are set to 0 V. As a result, a high electric field is applied to the tunnel insulating film TIF between the control gate CG and the floating gate FG, so that an FN tunnel current flows. Accordingly, the electrons in the floating gate FG are drawn out into the control gate CG through the tunnel insulating film TIF.

Specifically, in the present embodiment, since the floating gate FG has the sharp-edged portion (tip portion) Tip, a strong electric filed is generated due to the presence of the sharp-edged portion Tip. As a result, the electrons in the floating gate FG are mainly discharged from the sharp-edged portion Tip into the control gate CG. Thus, the sharp-edged portion Tip improves the efficiency of drawing out the electrons. By drawing out the electrons from the floating gate FG, the threshold voltage of the memory cell decreases.

(3) Reading Operation

Upon reading, the source and drain region SD on the side of the floating gate FG functions as a source, and the source and drain region SD on the side of the control gate CG functions as a drain, respectively. For example, voltages of +2.7 V and +0.5 V are applied to the control gate CG and the source and drain region SD on the side of the control gate CG, respectively. Then, the source and drain region SD on the side of the floating gate FG and the semiconductor substrate SUB (p-type well PW) are set to 0 V. In the case of an erasing cell, the threshold voltage is low, and a reading current flows. In contrast, in the case of a writing cell, a threshold voltage is high, and a reading current scarcely flows. By detecting this reading current, it is possible to determine whether the selected cell is a writing cell or an erasing cell, that is, to determine the stored data.

[Description of Manufacturing Method]

Next, a method of manufacturing the semiconductor device according to the present embodiment will be described with reference to FIGS. 7 to 29, and the configuration of the semiconductor device will be made clearer. FIGS. 7 to 29 are cross-sectional views and a plan view illustrating the manufacturing process of the semiconductor device according to the present embodiment. Regarding the cross-sectional views, A of each Figure illustrates a cross-section of the memory region 1A, and B of each Figure illustrates a cross-section of the monitor region 2A.

In the following, processes of forming the memory cell illustrated in FIGS. 1 and 2 in the memory region 1A and forming the monitor pattern illustrated in FIGS. 3 and 4 in the monitor region 2A will be described with reference to the drawings.

Figure 7A:
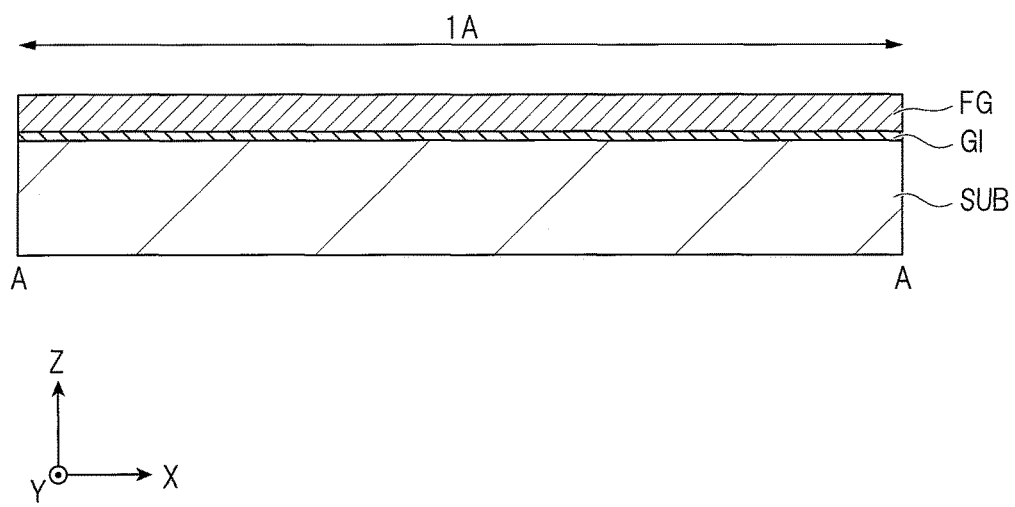
FIG. 7A is a cross-sectional view illustrating a manufacturing process of the semiconductor device according to the first embodiment.
Figure 7B:
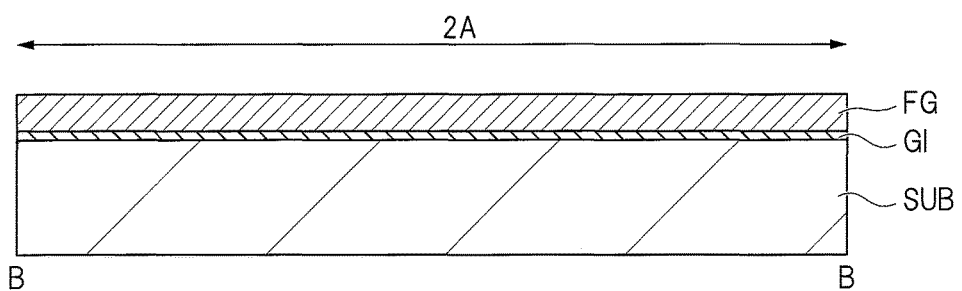
FIG. 7B is a cross-sectional view illustrating a manufacturing process of the semiconductor device according to the first embodiment.

As illustrated in FIG. 7, as the semiconductor substrate SUB, a semiconductor substrate SUB made of p-type monocrystalline silicon with a specific resistance of about 1 to 10 Ωcm, for example, is prepared. This semiconductor substrate SUB is a substantially disk-shaped wafer having a plurality of chip regions (CH), for example (see FIG. 6). Next, the gate insulating film GI is formed on the semiconductor substrate SUB. For example, a silicon oxide film having a film thickness of 100 angstroms is formed on the semiconductor substrate SUB by thermal oxidation. Note that 1 angstrom is $10^{-10}$ m. Next, a conductive film serving as the floating gate FG is formed on the gate insulating film GI. For example, a polysilicon film is formed on the gate insulating film GI by the CVD (Chemical Vapor Deposition).

Figure 8:
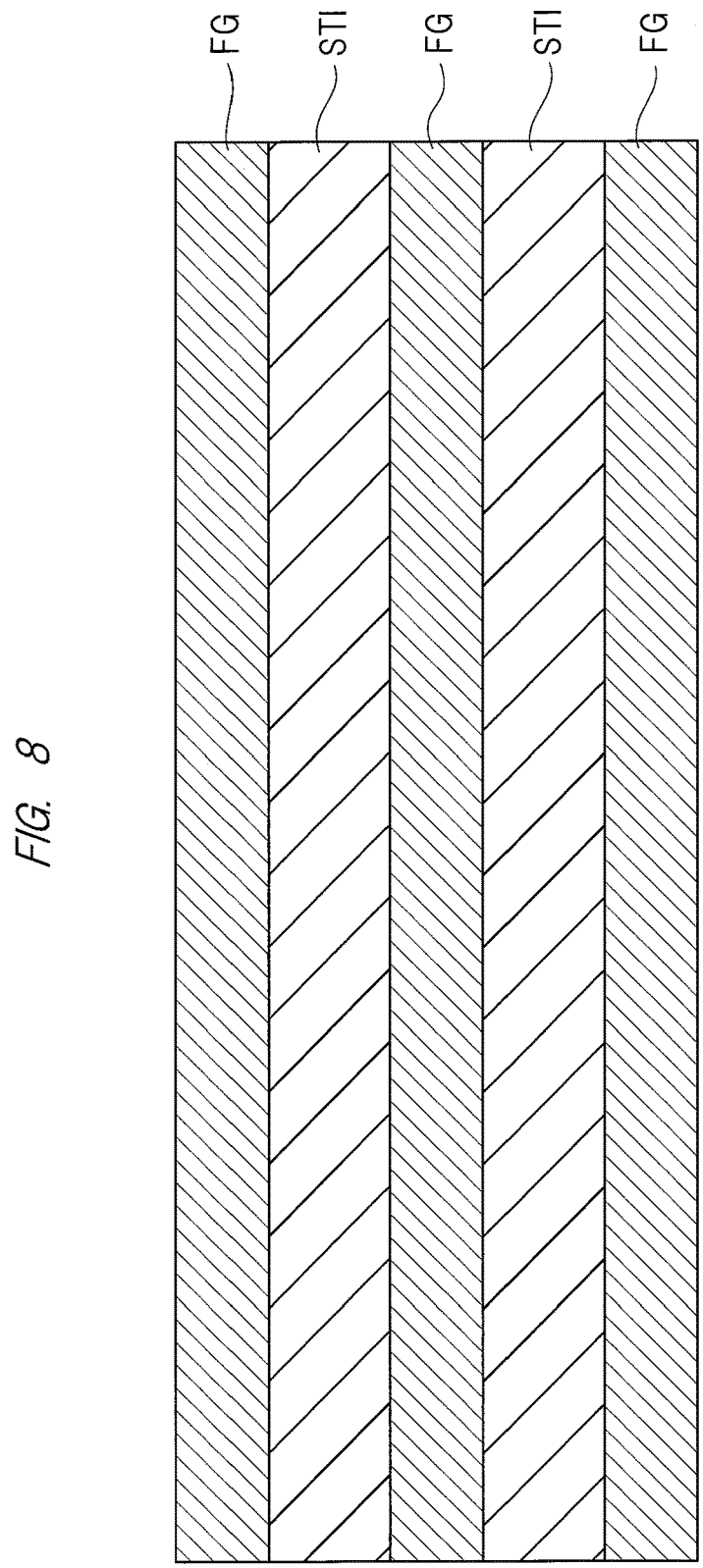
FIG. 8 is a plan view illustrating a manufacturing process of the semiconductor device according to the first embodiment.

Next, as illustrated in FIG. 8, an element isolation region is formed. For example, element isolation trenches are formed by etching the conductive film for the floating gate FG and the semiconductor substrate SUB through use of photolithography and dry etching techniques. Then, a silicon oxide film is deposited on the semiconductor substrate SUB including the inside of the element isolation trenches by the CVD or the like, and the silicon oxide film outside the element isolation trenches is removed by the CMP (Chemical Mechanical Polishing) or the like. Accordingly, an insulating film such as the silicon oxide film is buried inside the element isolation trenches. Such an element isolation method is referred to as the STI method.

Figure 9A:
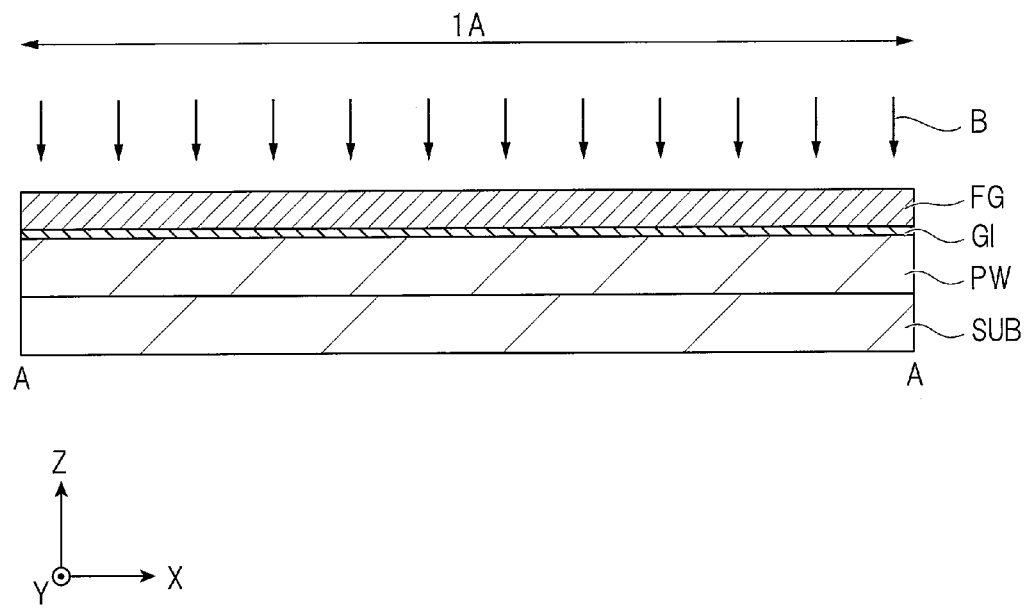
FIG. 9A is a cross-sectional view subsequent to FIG. 7A, illustrating a manufacturing process of the semiconductor device according to the first embodiment.
Figure 9B:
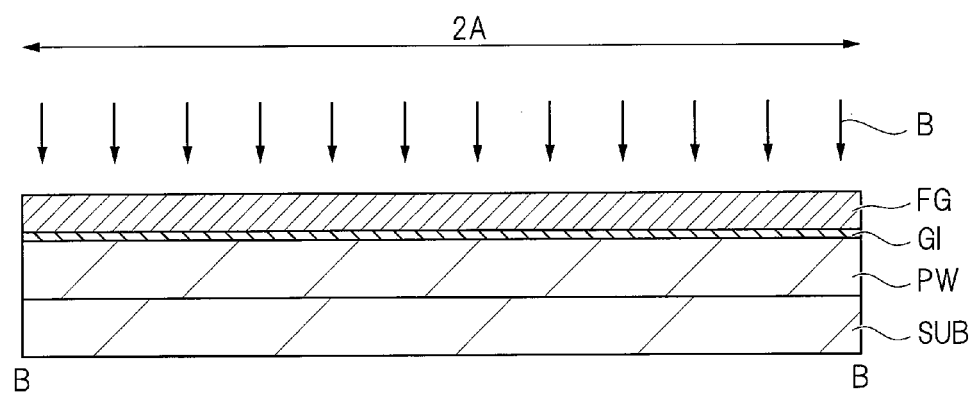
FIG. 9B is a cross-sectional view subsequent to FIG. 7B, illustrating a manufacturing process of the semiconductor device according to the first embodiment.

Next, as illustrated in FIG. 9, a p-type well PW is formed in the semiconductor substrate SUB. For example, by ion implantation of p-type impurity (for example, boron (B)) into the semiconductor substrate SUB, the p-type well PW is formed.

Figure 10A:
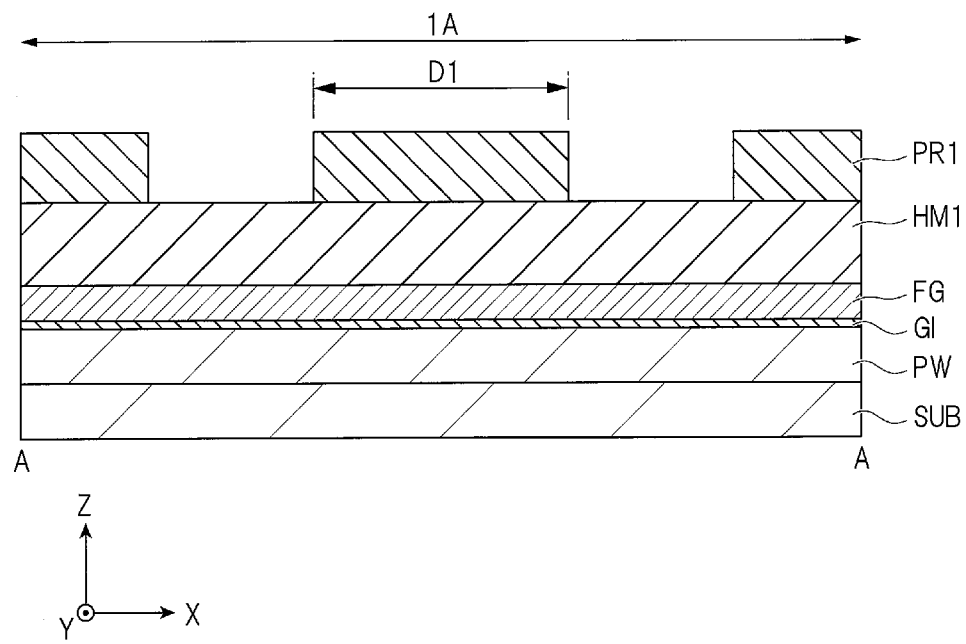
FIG. 10A is a cross-sectional view subsequent to FIG. 9A, illustrating a manufacturing process of the semiconductor device according to the first embodiment.
Figure 10B:
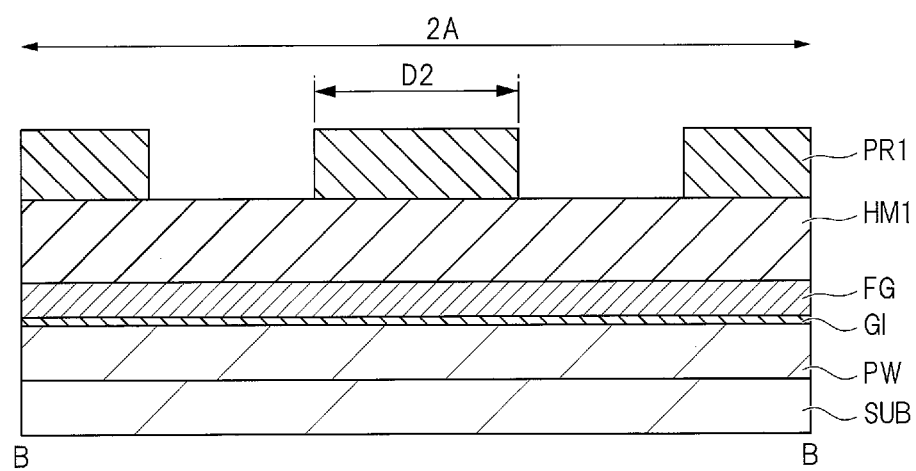
FIG. 10B is a cross-sectional view subsequent to FIG. 9B, illustrating a manufacturing process of the semiconductor device according to the first embodiment.

Next, as illustrated in FIG. 10, as a sacrificial film HM1, a relatively thick silicon nitride film having a film thickness of 3500 to 4000 angstroms is formed on the conductive film serving as the floating gate FG by the low pressure (LP) CVD. Then, a photoresist film PR1 is coated onto the sacrificial film HM1, and the photoresist film PR1 in the forming region of the plug PG and the floating gate FG is removed through use of the photolithography technique. In other words, the photoresist film PR1 is patterned to remain in the spaced portion corresponding to the distance between the pair of floating gates FG (distance D1 or D2).

Figure 11A:
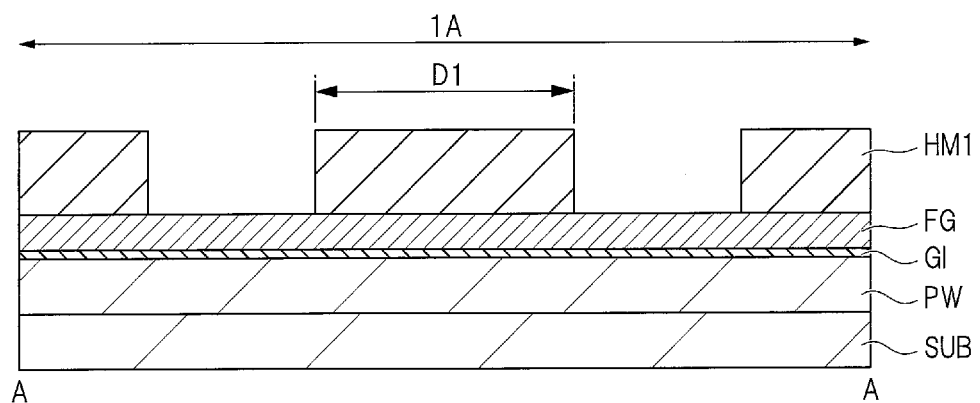
FIG. 11A is a cross-sectional view subsequent to FIG. 10A, illustrating a manufacturing process of the semiconductor device according to the first embodiment.
Figure 11A:
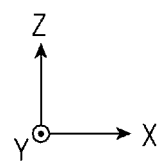
Figure 11B:
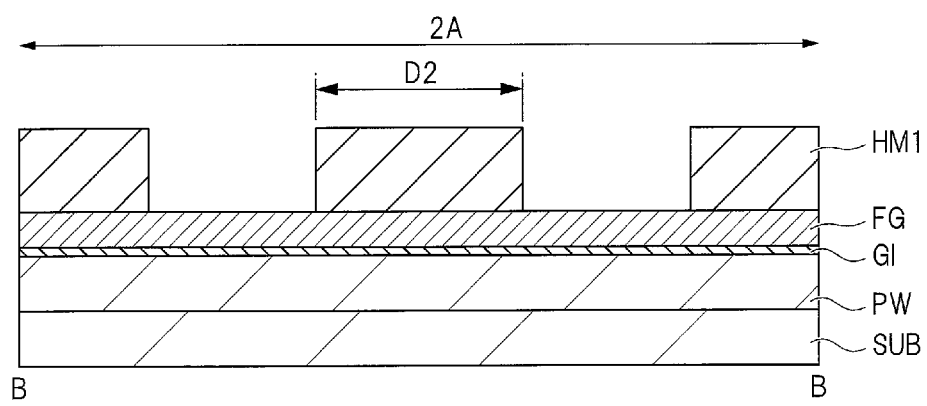
FIG. 11B is a cross-sectional view subsequent to FIG. 10B, illustrating a manufacturing process of the semiconductor device according to the first embodiment.

Next, as illustrated in FIG. 11, the sacrificial film HM1 is etched using the photoresist film PR1 as a mask. As to etching, anisotropic dry etching is performed, for example. Accordingly, the sacrificial film HM1 having an opening in the forming region of the plug PG and the floating gate FG is formed. In other words, the sacrificial film HM1 is etched to remain in the spaced portion corresponding to the distance between the pair of floating gates FG (distance D1 or D2). Accordingly, a width of the sacrificial film HM1 in the memory region 1A (a width in the X direction) corresponds to the distance D1, and a width of the sacrificial film HM1 in the monitor region 2A (a width in the X direction) corresponds to the distance D2. Then, the photoresist film PR1 is removed by asking.

Figure 12A:
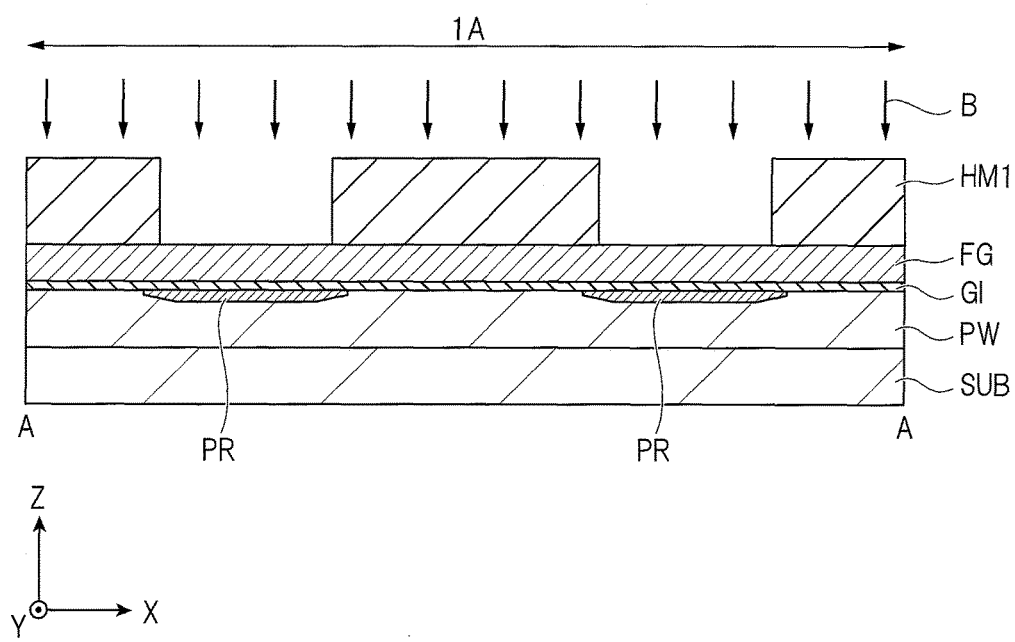
FIG. 12A is a cross-sectional view subsequent to FIG. 11A, illustrating a manufacturing process of the semiconductor device according to the first embodiment.
Figure 12B:
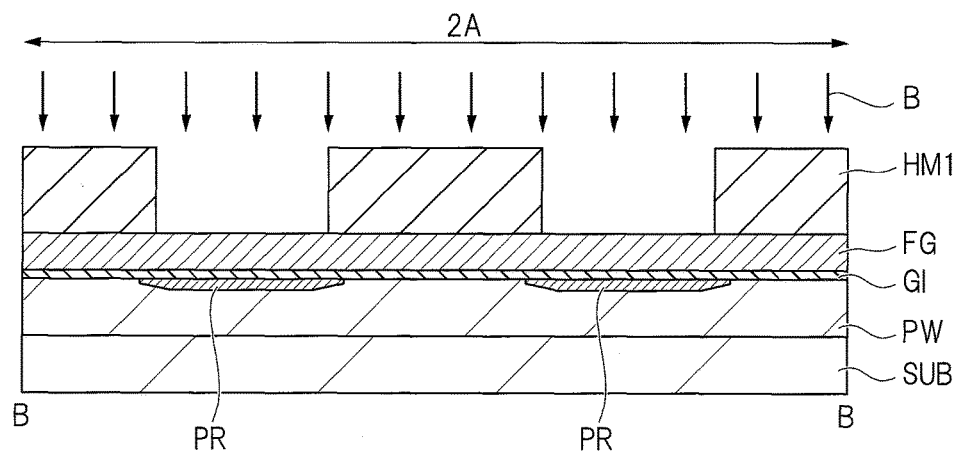
FIG. 12B is a cross-sectional view subsequent to FIG. 11B, illustrating a manufacturing process of the semiconductor device according to the first embodiment.

Next, as illustrated in FIG. 12, by ion implantation of p-type impurity (for example, boron (B)) into the semiconductor substrate SUB, using the sacrificial film HM1 as a mask, a p-type semiconductor region PR is formed. The p-type semiconductor region PR is provided for control of threshold voltage.

Figure 13A:
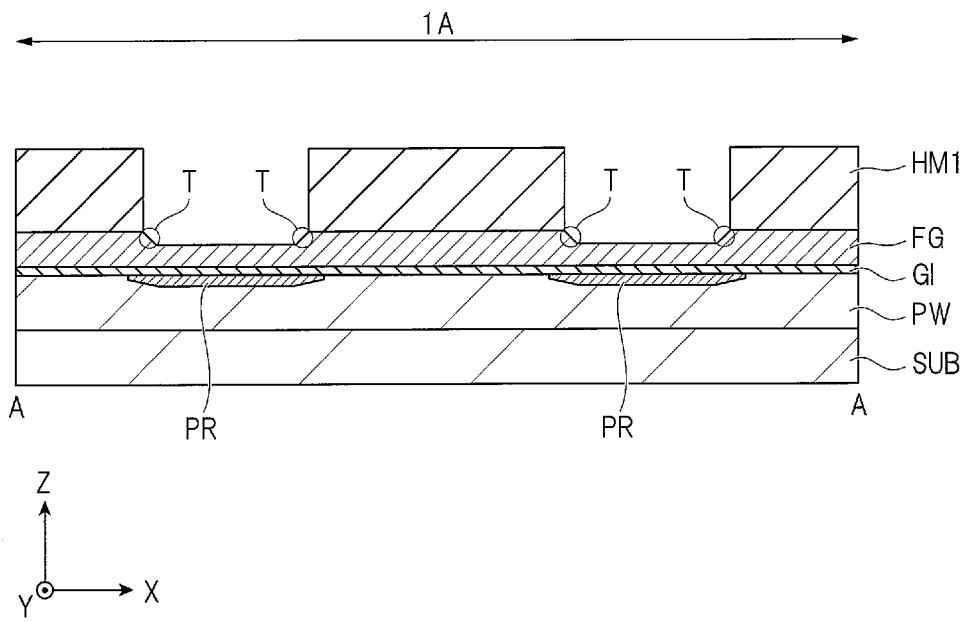
FIG. 13A is a cross-sectional view subsequent to FIG. 12A, illustrating a manufacturing process of the semiconductor device according to the first embodiment.
Figure 13B:
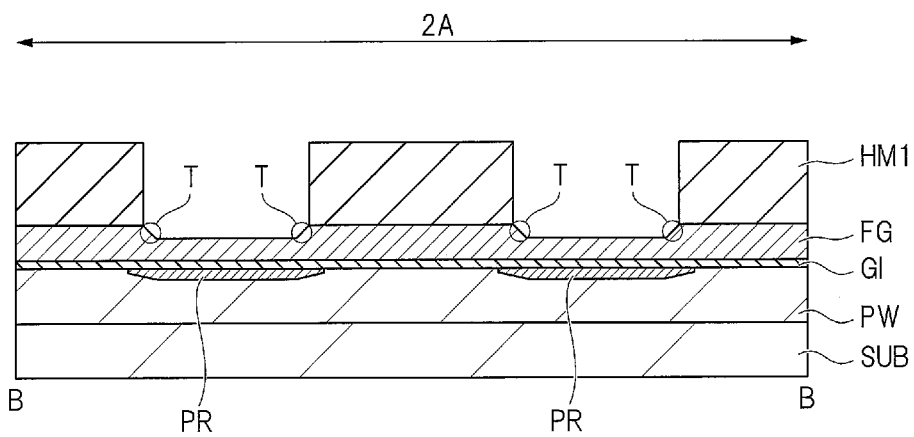
FIG. 13B is a cross-sectional view subsequent to FIG. 12B, illustrating a manufacturing process of the semiconductor device according to the first embodiment.

Next, as illustrated in FIG. 13, an upper portion of the conductive film which is exposed on the bottom surface of the opening of the sacrificial film HM1 and serves as the floating gate FG is etched. Upon this etching, etching condition is adjusted in such a way that the conductive film (FG) has a tapered (sloped) shape in the bottom portion on the side surface of the opening of the sacrificial film HM1. As to etching, dry etching is performed, for example. The tapered surface (sloped surface) of the conductive film (FG) is indicated as T. This tapered surface (sloped surface) T serves as the sharp-edged portion Tip.

Figure 14A:
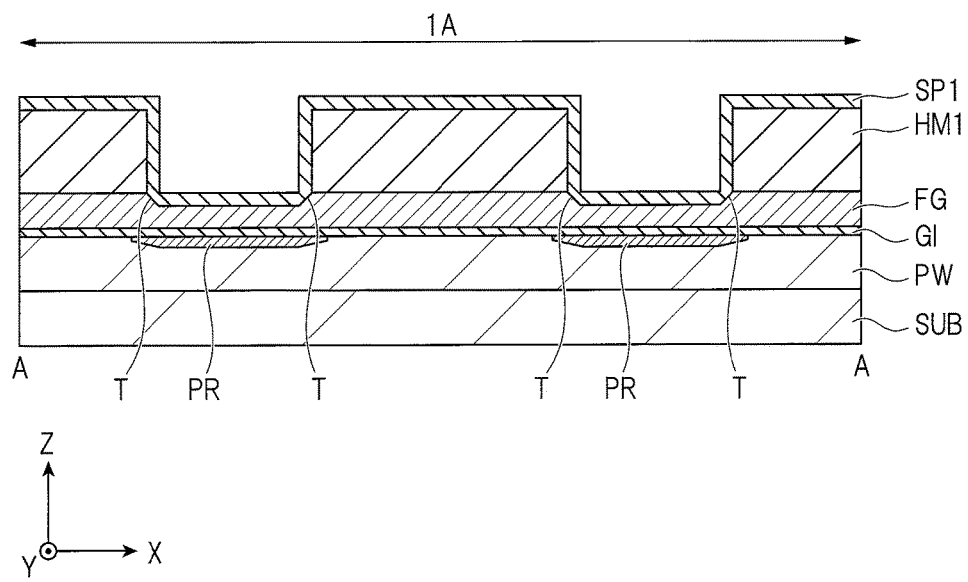
FIG. 14A is a cross-sectional view subsequent to FIG. 13A, illustrating a manufacturing process of the semiconductor device according to the first embodiment.
Figure 14B:
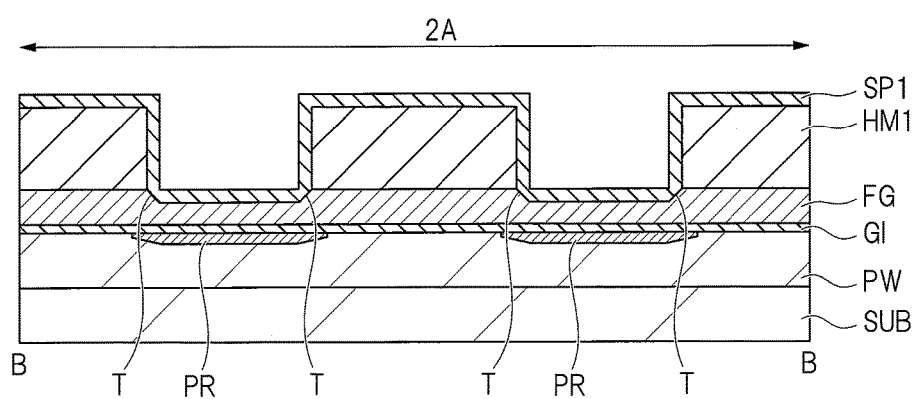
FIG. 14B is a cross-sectional view subsequent to FIG. 13B, illustrating a manufacturing process of the semiconductor device according to the first embodiment.

Next, as illustrated in FIG. 14, a silicon oxide film serving as the spacer SP1 and having a film thickness of 100 to 200 angstroms is formed over the sacrificial film HM1 and the conductive film (FG) by the LPCVD. As a sort of the silicon oxide film, a TEOS-NSG film may be used. The TEOS-NSG film is an NSG (non-doped silicate glass) film which has grown through use of mixed gas containing TEOS (tetra-ethoxy silane, $(C_2H_5O)_4Si$) and $O_3$. Further, after this process, the TEOS-NSG film may be baked by a heat treatment. In this case, however, the baking of the TEOS-NSG film is controlled so as not to be harder than a high-temperature oxide film to be formed in the process described later.

Figure 15A:
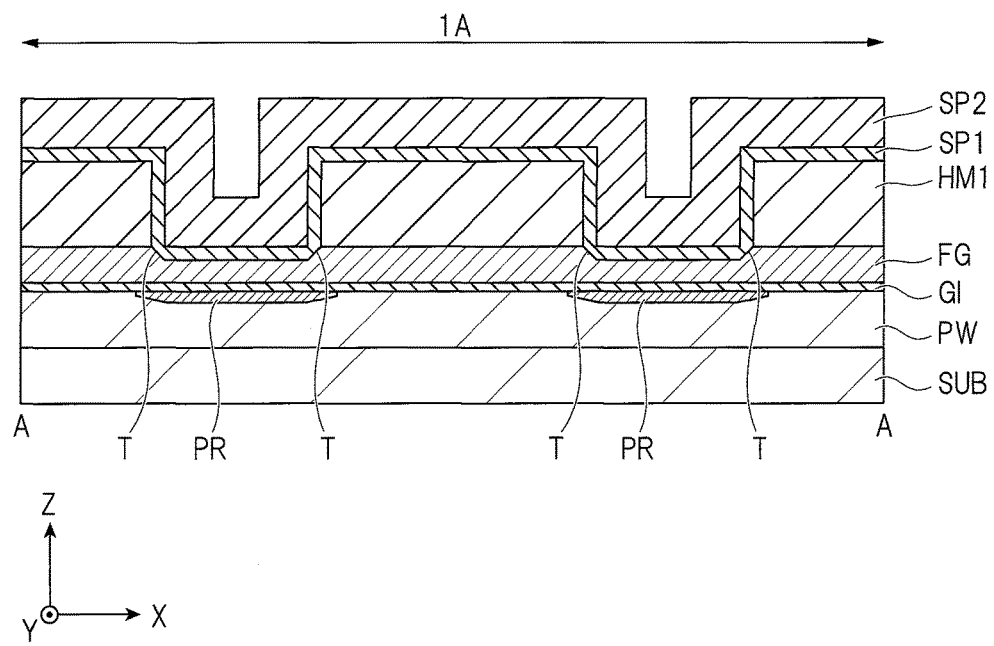
FIG. 15A is a cross-sectional view subsequent to FIG. 14A, illustrating a manufacturing process of the semiconductor device according to the first embodiment.
Figure 15B:
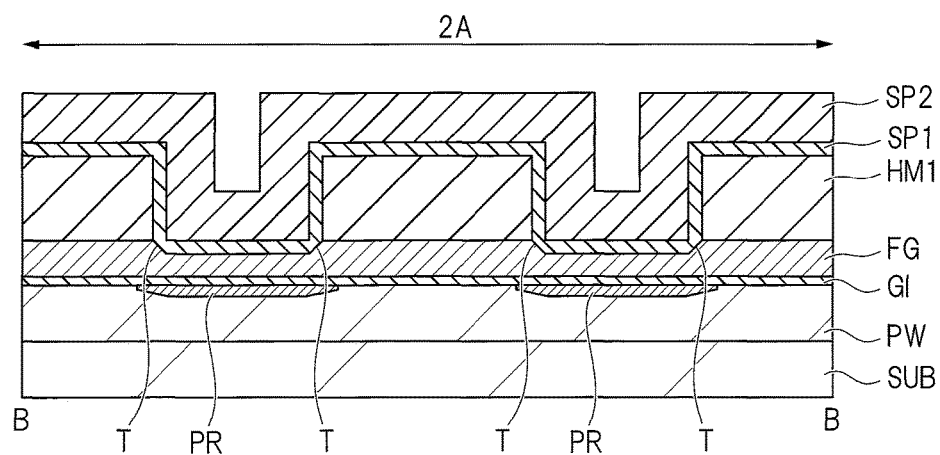
FIG. 15B is a cross-sectional view subsequent to FIG. 14B, illustrating a manufacturing process of the semiconductor device according to the first embodiment.

Next, as illustrated in FIG. 15, a silicon oxide film serving as the spacer SP2 and having a film thickness of 1900 to 2000 angstroms is formed over the TEOS-NSG film serving as the spacer SP1 by the CVD or the like. As a material of an insulating film for the spacer SP2, the one having a lower etching rate than a material of an insulating film for the spacer SP1 is used. For example, as a sort of the silicon oxide film, a hard high-temperature oxide film (having a low etching rate) may be used. For example, the high-temperature oxide film may be formed by the CVD at 800° C.

Figure 16A:
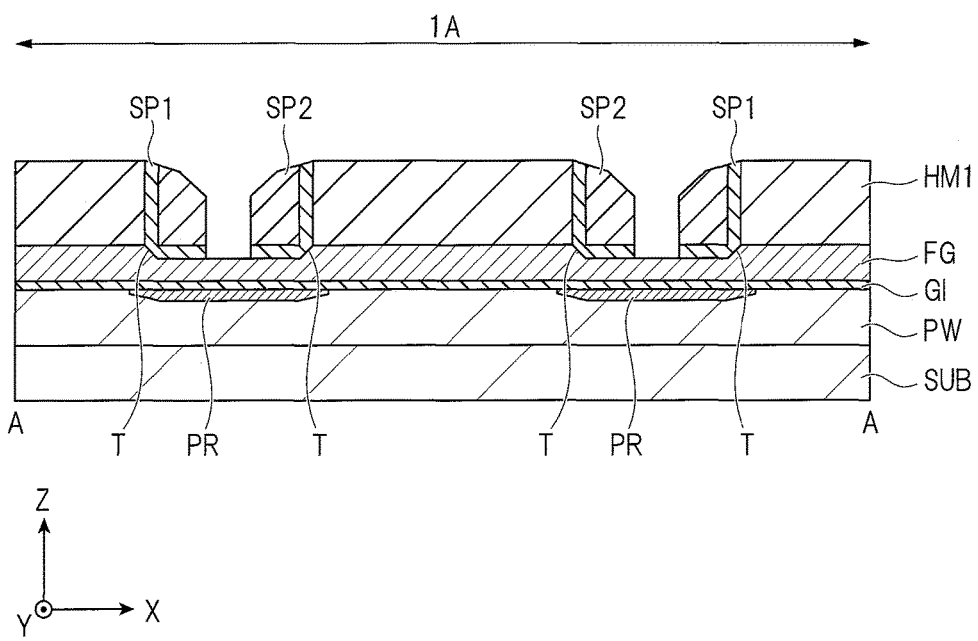
FIG. 16A is a cross-sectional view subsequent to FIG. 15A, illustrating a manufacturing process of the semiconductor device according to the first embodiment.
Figure 16B:
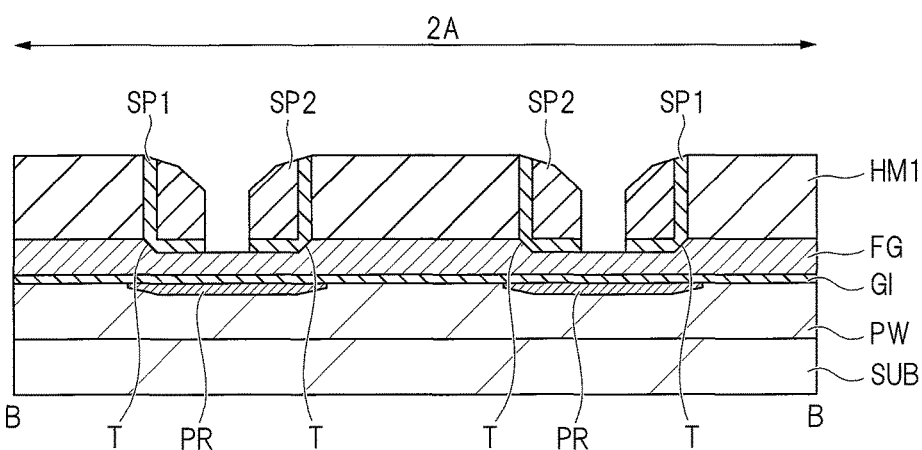
FIG. 16B is a cross-sectional view subsequent to FIG. 15B, illustrating a manufacturing process of the semiconductor device according to the first embodiment.

Next, as illustrated in FIG. 16, a laminate film composed of the TEOS-NSG film and the high-temperature oxide film serving as the spacer insulating film (SP1 and SP2) is etched back. In this etch-back process, the laminate film is removed by a predetermined film thickness from the front surface thereof by anisotropic dry etching. This etch-back process enables the laminate film to remain in a sidewall shape on each of sidewalls of the sacrificial film HM1. Of the laminate film in a sidewall shape, the film of the lower layer serves as the spacer SP1, and the film of the upper layer serves as the spacer SP2. The spacer SP1 is formed so as to cover a lower surface and a side surface of the spacer SP2.

Note that, of the laminate film (the TEOS-NSG film and the high-temperature oxide film), the film of the upper layer may be etched back to remain in a sidewall shape and to form the spacer SP2, and then, the film of the lower layer may be etched using the spacer SP2 as a mask to form the spacer SP1.

Figure 17A:
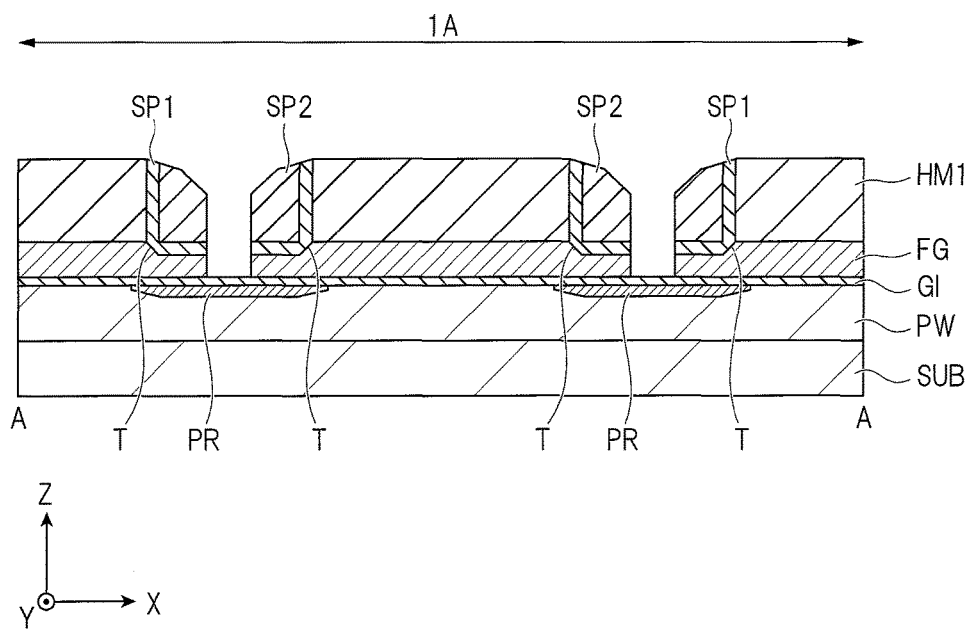
FIG. 17A is a cross-sectional view subsequent to FIG. 16A, illustrating a manufacturing process of the semiconductor device according to the first embodiment.
Figure 17B:
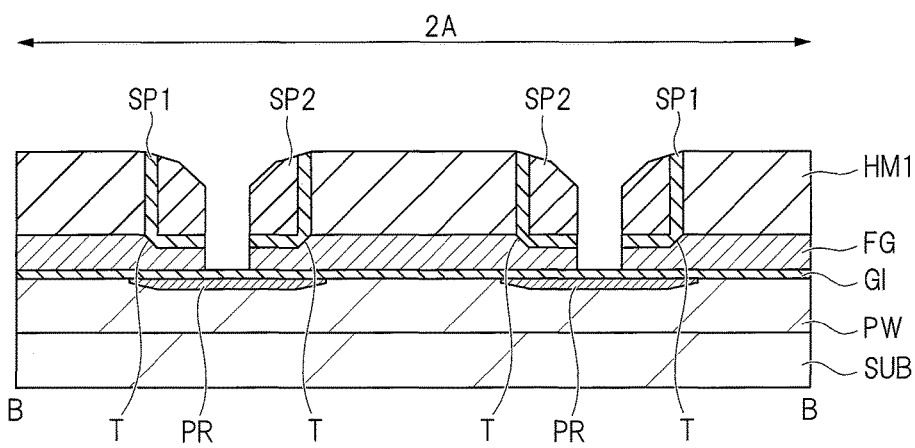
FIG. 17B is a cross-sectional view subsequent to FIG. 16B, illustrating a manufacturing process of the semiconductor device according to the first embodiment.

Next, as illustrated in FIG. 17, the conductive film (FG) is etched using the spacer insulating film (SP1 and SP2) and the sacrificial film HM1 as a mask. Since the etching region for the conductive film (FG) in the memory region 1A is the same as that in the monitor region 2A, the tapered portion TR is not formed here. In other words, etching conditions in such a way that the tapered portion TR is not formed can be easily adjusted. Accordingly, side surfaces of the floating gate FG on the side of the plug PG are formed.

Figure 18A:
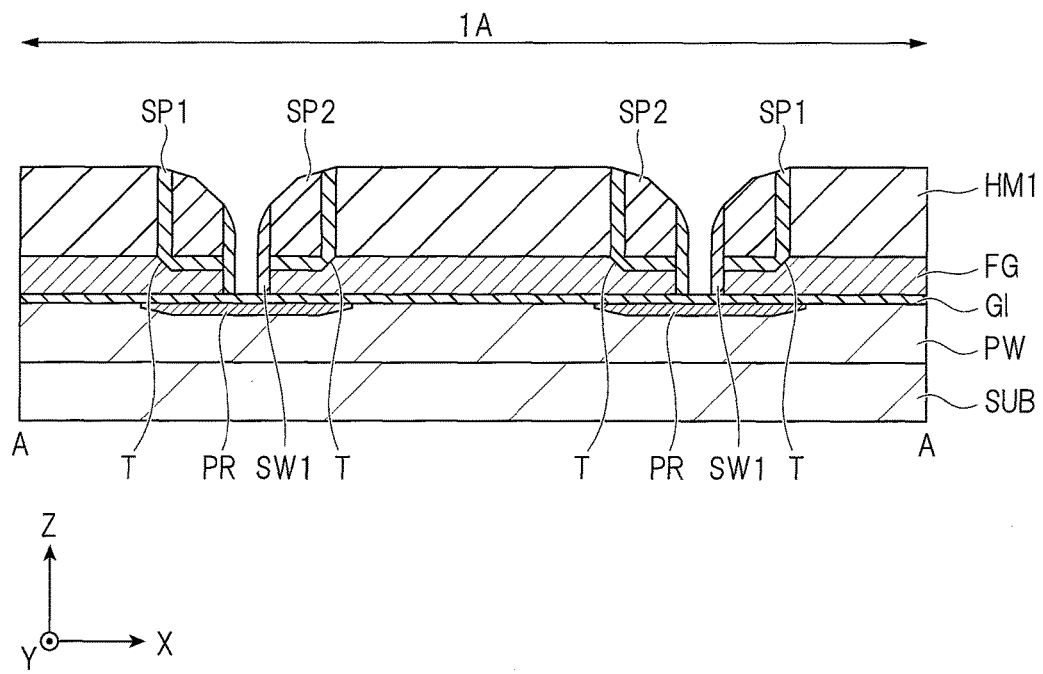
FIG. 18A is a cross-sectional view subsequent to FIG. 17A, illustrating a manufacturing process of the semiconductor device according to the first embodiment.
Figure 18B:
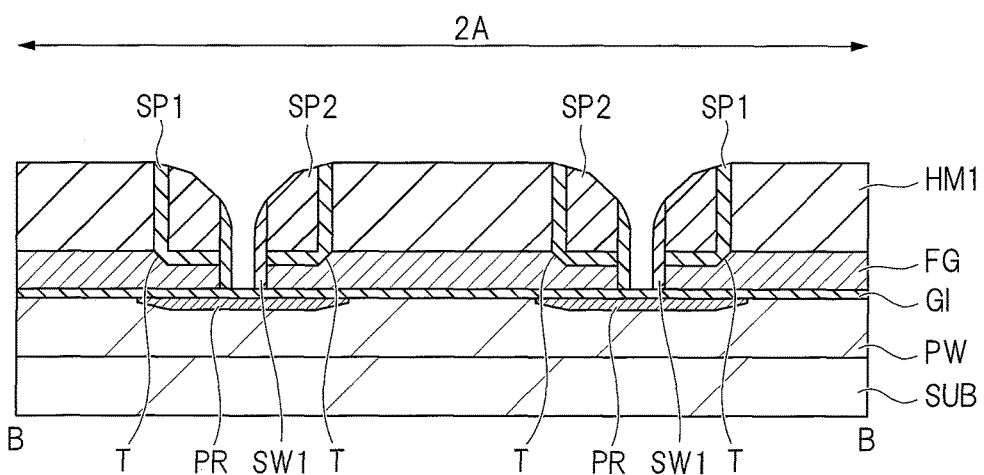
FIG. 18B is a cross-sectional view subsequent to FIG. 17B, illustrating a manufacturing process of the semiconductor device according to the first embodiment.

Next, as illustrated in FIG. 18, a silicon oxide film serving as the sidewall insulating film SW1 is formed over the entire surface of the semiconductor substrate SUB by the CVD or the like and etched back. In this etch-back process, the sidewall insulating film SW1 is formed on each sidewall of the floating gate FG and the spacer insulating film (SP1 and SP2) thereon.

Figure 19A:
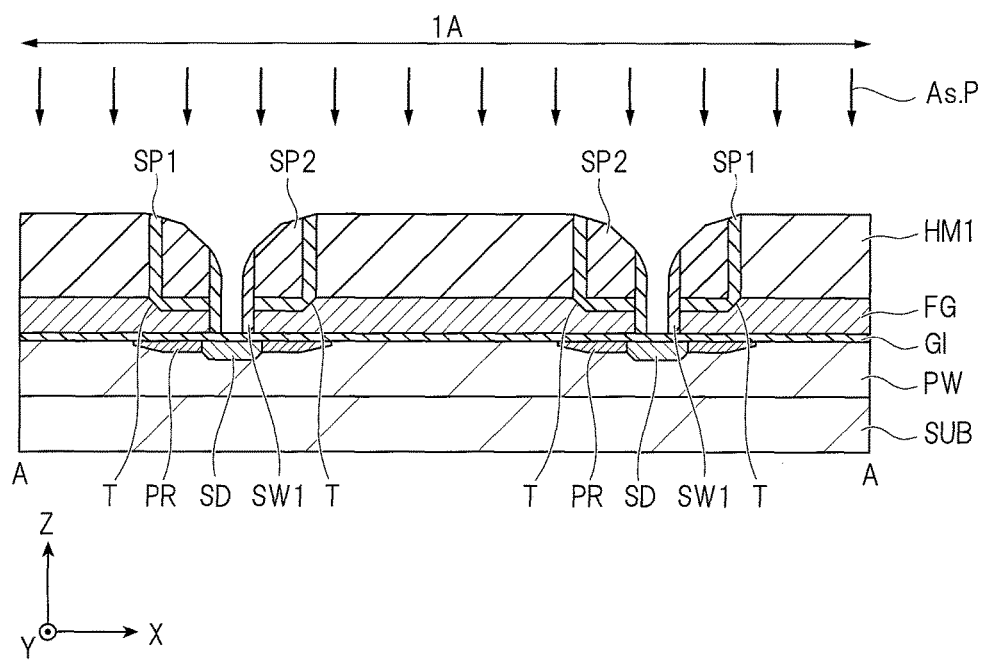
FIG. 19A is a cross-sectional view subsequent to FIG. 18A, illustrating a manufacturing process of the semiconductor device according to the first embodiment.
Figure 19B:
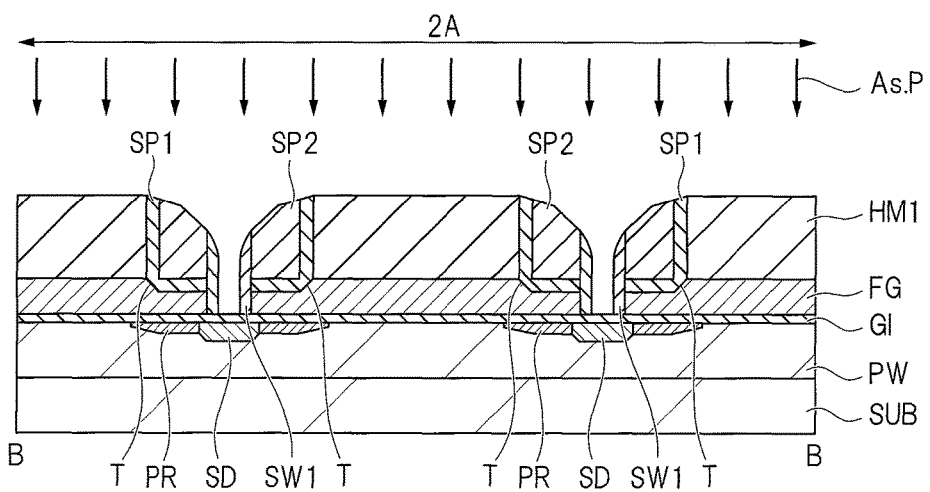
FIG. 19B is a cross-sectional view subsequent to FIG. 18B, illustrating a manufacturing process of the semiconductor device according to the first embodiment.

Next, as illustrated in FIG. 19, by ion implantation of n-type impurity (for example, arsenic (As) or phosphorus (P)) into the semiconductor substrate SUB, using the sacrificial film HM1, the spacer insulating film (SP1 and SP2), and the sidewall insulating film SW1 as a mask, a source and drain region SD is formed between the sidewall insulating films SW1. In other words, in the semiconductor substrate SUB outside the sacrificial film HM1 and the pair of the spacer insulating films (SP1 and SP2) on the opposite ends thereof, the source and drain region SD is formed. This source and drain region SD serves as the source and drain region SD on the side of the floating gate FG. For example, n-type impurity is implanted under the condition of implantation energy of 40 keV and dose amount of $5 \times 10^{15}$ cm$^{-2}$.

Figure 20A:
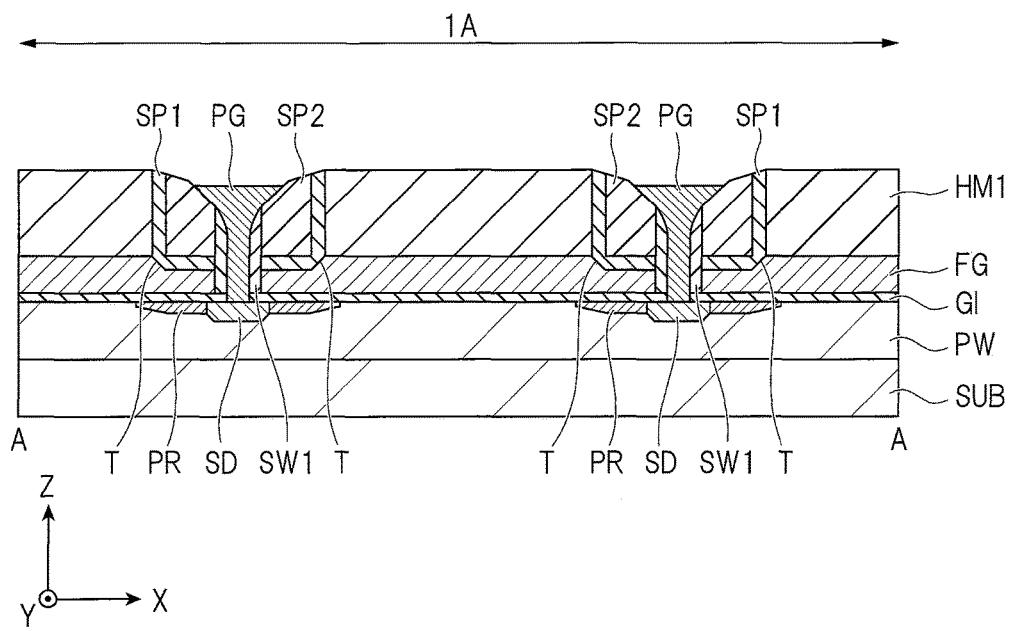
FIG. 20A is a cross-sectional view subsequent to FIG. 19A, illustrating a manufacturing process of the semiconductor device according to the first embodiment.
Figure 20B:
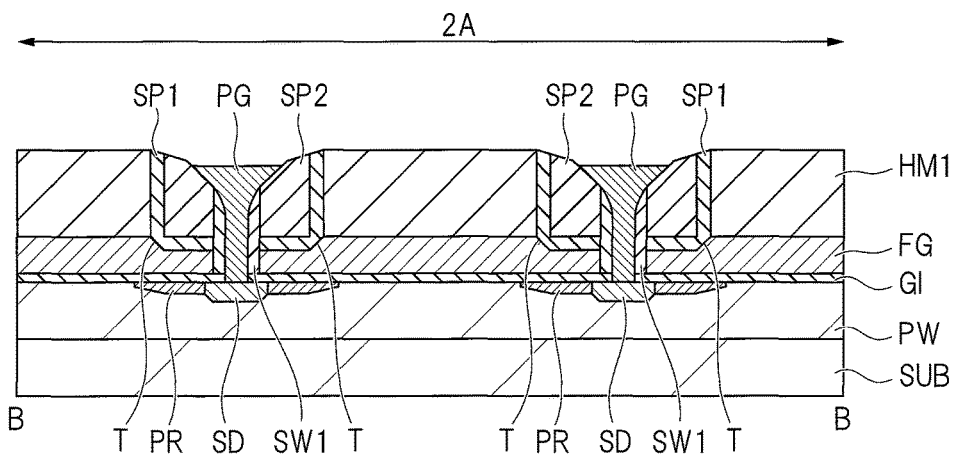
FIG. 20B is a cross-sectional view subsequent to FIG. 19B, illustrating a manufacturing process of the semiconductor device according to the first embodiment.

Next, as illustrated in FIG. 20, a gate insulating film GI exposed between the sidewall insulating films SW1 is etched. Accordingly, the source and drain region SD is exposed on the front surface of the semiconductor substrate SUB between the sidewall insulating films SW1. Next, a polysilicon film serving as the conductive film for the plug PG is formed over the entire surface of the semiconductor substrate SUB by the CVD or the like. Then, the polysilicon film on the sacrificial film HM1 and the spacer SP1 is removed by the CMP or the like. Then, the upper portion of the polysilicon film between the pair of the spacer insulating films (SP1 and SP2) is removed by etching back. Accordingly, the plug PG which is buried between the pair of spacer insulating films (SP1 and SP2) is formed. This plug PG is formed on the drain and source region SD.

Next, n-type impurity (for example, arsenic (As) or phosphorus (P)) is implanted into the entire surface of the semiconductor substrate SUB. For example, n-type impurity is implanted under the condition of implantation energy of 40 keV and dose amount of $5 \times 10^{15}$ cm$^{-2}$. Accordingly, the n-type impurity is doped into the upper portion of the plug PG, so that oxidation can be accelerated in a thermal oxidation process in which a plug insulating film PGI to be described later is formed.

Figure 21A:
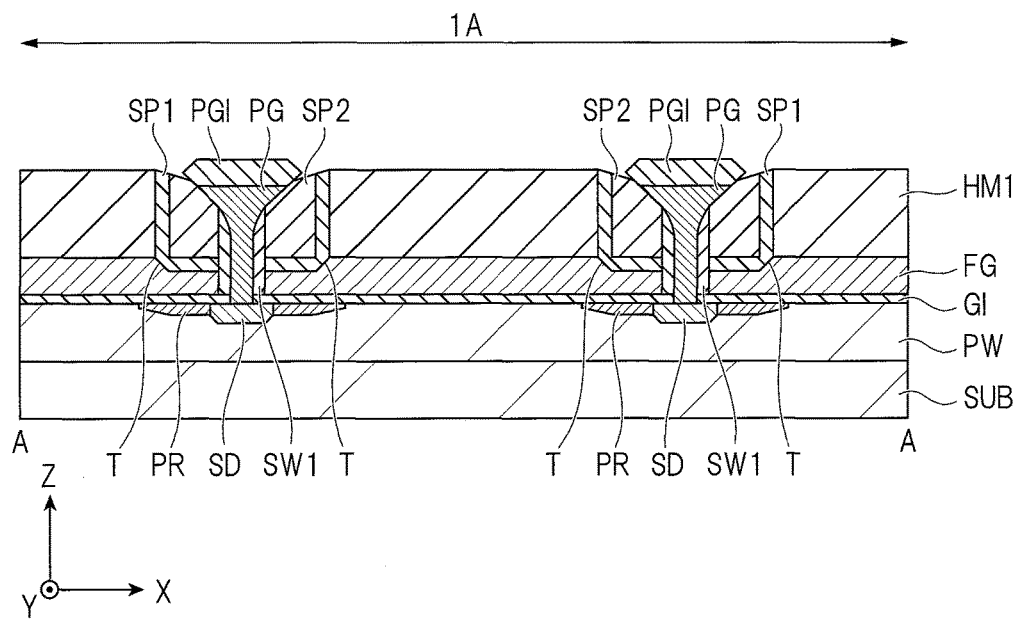
FIG. 21A is a cross-sectional view subsequent to FIG. 20A, illustrating a manufacturing process of the semiconductor device according to the first embodiment.
Figure 21B:
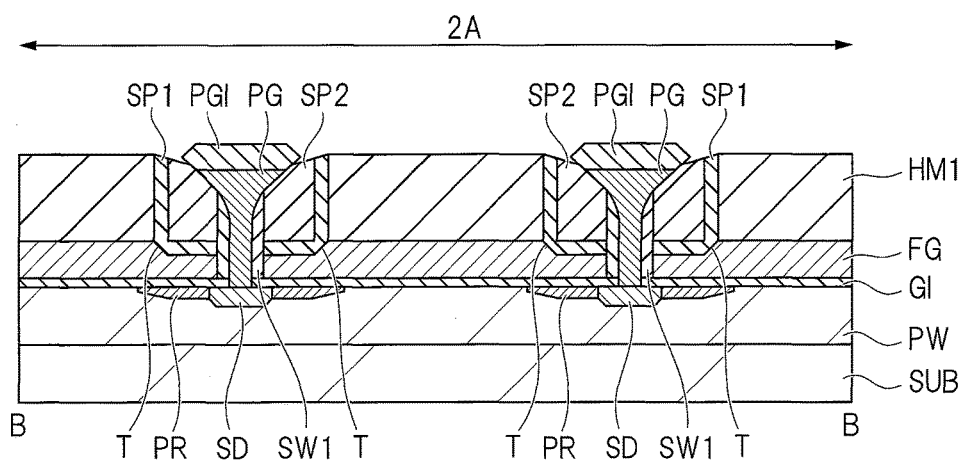
FIG. 21B is a cross-sectional view subsequent to FIG. 20B, illustrating a manufacturing process of the semiconductor device according to the first embodiment.

Next, as illustrated in FIG. 21, by thermal oxidation treatment, the polysilicon film on the upper portion of the plug PG is oxidized to form the plug insulating film PGI on the plug PG.

Figure 22A:
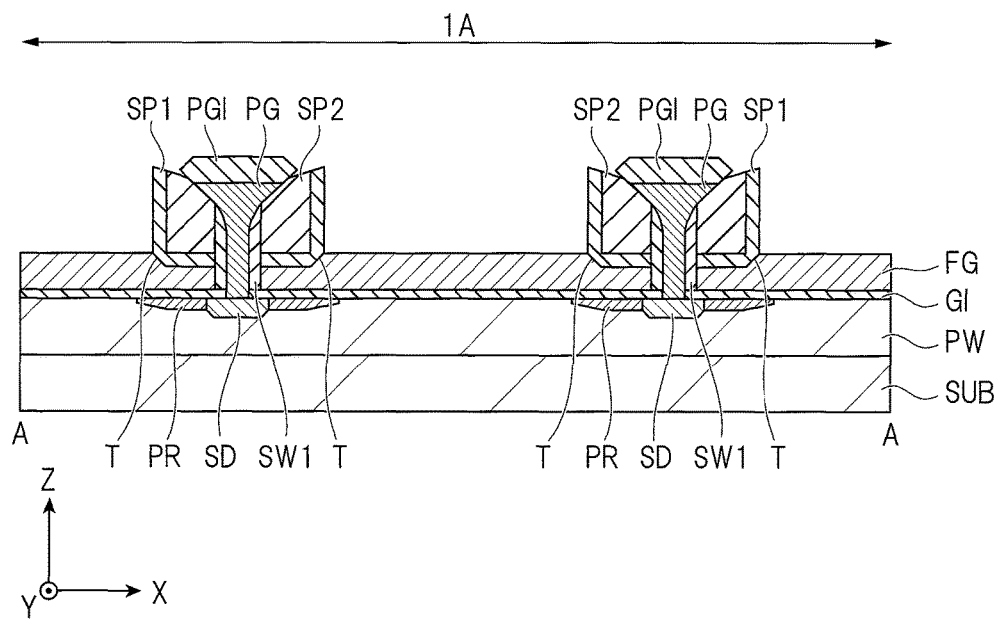
FIG. 22A is a cross-sectional view subsequent to FIG. 21A, illustrating a manufacturing process of the semiconductor device according to the first embodiment.
Figure 22B:
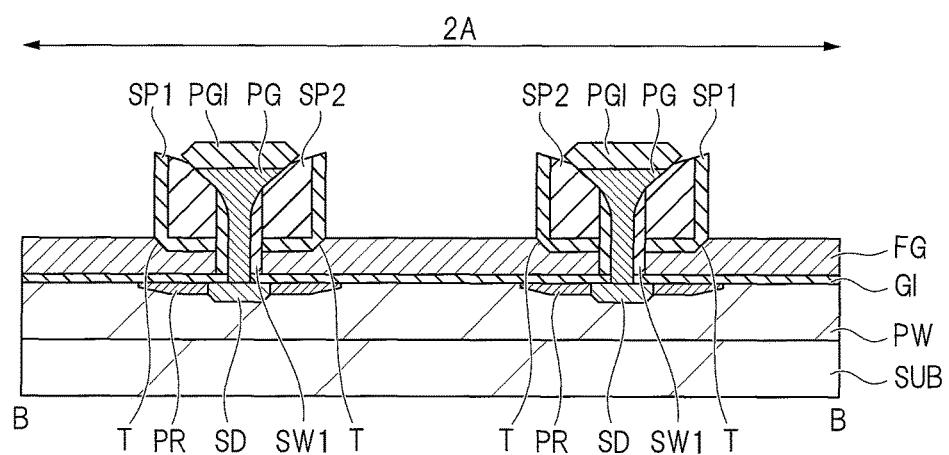
FIG. 22B is a cross-sectional view subsequent to FIG. 21B, illustrating a manufacturing process of the semiconductor device according to the first embodiment.

Next, as illustrated in FIG. 22, the sacrificial film HM1 is removed by etching. For example, by wet etching through use of phosphoric acid, the sacrificial film (silicon nitride film) HM1 is removed. This wet etching is, for example, carried out under such a condition that the semiconductor substrate (wafer) SUB is immersed in the H$_3$PO$_4$ solution (having a concentration of 86%) at a temperature of 160° C. for a predetermined time. Accordingly, the conductive film (FG) covered with the sacrificial film HM1 is exposed.

Next, as illustrated in FIG. 23, the exposed conductive film (FG) is etched. That is, the conductive film (FG) is subjected to dry etching using the plug insulating film PGI and the spacer insulating film (SP1 and SP2) as a mask. Accordingly, the floating gate FG made of the conductive film is formed. Then, in this process, the sharp-edged portion (tip portion) Tip is formed in the vicinity of the upper portion of the side surface of the floating gate FG.

Here, a distance between the floating gates FG, in other words, a distance between the pair of spacer insulating films (SP1 and SP2) is the distance D2 in the monitor region 2A and set to be smaller than the distance D1 in the memory region 1A (distance D2<distance D1). Accordingly, in the monitor region 2A, the tapered portion TR is formed in the floating gate FG (micro-loading effect).

The micro-loading effect is a phenomenon in which, when there are two portions to be patterned, one having a large pattern width and the other having a small pattern width, the portion having a large pattern width has a higher etching rate. Here, by making use of the difference between the etching rates due to the different pattern widths on purpose, the tapered portion TR is formed in the monitor region 2A.

The tapered portion TR of the floating gate FG in the monitor region 2A is larger than the tapered portion TR of the floating gate FG in the memory region 1A. In other words, the protruding amount L2 of the floating gate FG in the monitor region 2A is larger than the protruding amount L1 of the floating gate FG in the memory region 1A (L2>L1). Note that FIG. 23A describes that the tapered portion TR of the floating gate FG in the memory region 1A is not present (the protruding amount L1=0).

Thus, since the tapered portion TR protrudes from the spacer insulating film (SP1 and SP2), the tapered portion TR can be checked from above. In other words, since the floating gate FG has a portion which does not overlap the spacer insulating film (SP1 and SP2) of the upper layer thereof, the floating gate FG can be checked from above.

Accordingly, for example, after the process of FIG. 23, the floating gate FG is checked from above to check the tapered portions TR and the protruding amounts in both of the monitor region 2A and the memory region 1A, so that determination whether the shape of the floating gate FG in the memory region 1A (etching status, dimensions, or the like) is good or not can be made.

For example, each piece of data such as etching condition, the protruding amount L2 from the spacer insulating film (SP1 and SP2) in the monitor region 2A, and the shape of the floating gate FG in the memory region 1A (etching status, dimensions, or the like) is accumulated to decide a reference value of the protruding amount. Then, when the protruding amount L2 is larger than the reference value, it is determined that etching is not sufficient. Also, when the protruding amount L2 is smaller than the reference value, it is determined that etching is excessively carried out. Moreover, a difference or a ratio of the protruding amounts (L2–L1 or L1/L2) or the like may be used as an index for determination.

Thus, without a need of checking the floating gate FG in the memory region 1A point by point through use of cross-sectional SEM or the like, the shape of the floating gate FG in the memory region 1A can be checked in a non-destructive manner.

Accordingly, for example, when a defect in shape of the floating gate FG in the memory region 1A is predicated, it is possible to review the etching condition of the floating gate FG at this stage and feed back the reviewed etching condition to the subsequent wafer process. In this manner, it is possible to prevent variation in shape of the floating gate FG which is a part for accumulating and discharging electric charges and gets deeply involved in the characteristics of writing and erasing stored data and to manufacture a uniform semiconductor device having favorable characteristics. In addition, it is possible to minimize a defect of the semiconductor device, thereby improving product yield.

Figure 24A:
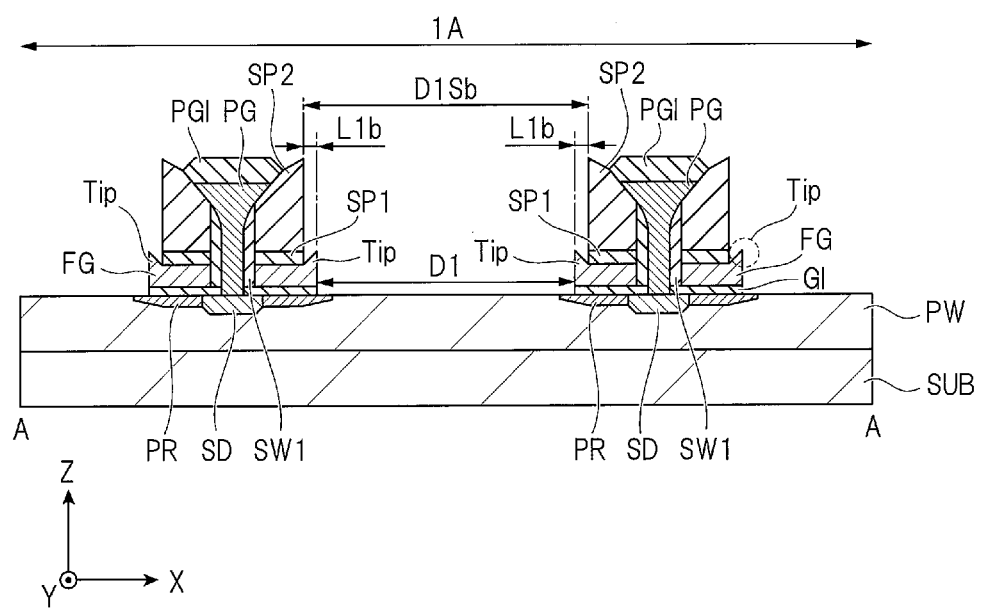
FIG. 24A is a cross-sectional view subsequent to FIG. 23A, illustrating a manufacturing process of the semiconductor device according to the first embodiment.

Next, as illustrated in FIG. 24, the spacer SP1 on the sidewall of the spacer SP2 is removed by wet etching. Accordingly, the sharp-edged portion Tip at the end of the floating gate FG is exposed. The sharp-edged portion Tip has a tip at the upper end of the side surface of the floating gate FG and includes a side surface and a tapered surface (T) inclining in an inward direction of the floating gate FG from the tip. In other words, the sharp-edged portion Tip is a substantially triangular portion in section, defined by the side surface and the tapered surface (T). Also, a definition of a distance between the floating gates FG will be described herein. As described above, since the tapered portion TR is formed in the monitor region 2A, it is difficult to define the distance between the floating gates FG (distance D1 or D2). For example, the distance between the floating gates FG (distance D1 or D2) can be defined as a distance between the upper portions of the side surfaces of the floating gates FG (tips of the sharp-edged portions Tip). Note that, since the distance between the floating gates FG (distance D1 or D2) is relatively larger than the length of the tapered portion TR, there is no big problem in regarding the distance between the floating gates FG (distance D1 or D2) as the distance between the intermediate portions of the side surfaces thereof or the distance between the bottom portions of the side surfaces thereof.

The above wet etching is carried out for 30 seconds through use of 5% hydrofluoric acid, for example. Note that the spacer SP1 disposed under the spacer SP2 is not etched and remains.

At this stage (the stage in FIG. 24), the tapered portion TR of the floating gate FG in the monitor region 2A may be checked to determine whether the shape of the floating gate FG in the memory region 1A is good or not.

Here, the distance between the spacer insulating films (SP1 and SP2) is a distance D2Sb in the monitor region 2A and a distance D1Sb in the memory region 1A. That is, the distance between the spacer insulating films (SP1 and SP2) in each of the monitor region 2A and the memory region 1A becomes large by a film thickness of the spacer SP1. Then, the distance D2Sb in the monitor region 2A is smaller than the distance D1Sb in the memory region 1A (the distance D2Sb<the distance D1Sb).

Thus, in the monitor region 2A, the protruding amount L2b by which the floating gate FG protrudes from the spacer insulating film (SP1 and SP2) becomes large, so that a determination whether the shape of the floating gate FG is good or not can be easily made. In addition, also in the memory region 1A, the protruding amount L1b by which the floating gate FG protrudes from the spacer insulating film (SP1 and SP2) becomes large, so that a relative comparison between the protruding amounts L1b and L2b is easily made and a determination with a higher degree of accuracy can be made.

Note that, upon the above wet etching, since the upper portion of the spacer SP2 is also exposed to the etching solution, film thinning of the spacer SP2 is concerned. However, since the spacer SP2 is composed of a film having a small etching rate, the etching speed of the spacer SP2 is slower than the etching speed of the spacer SP1. Accordingly, while suppressing the film thinning of the spacer SP2, the spacer SP1 can be removed. As a result, the height of the spacer SP2 can be secured. Note that, although an example of wet etching has been described here, dry etching may be used instead of wet etching.

Figure 25A:
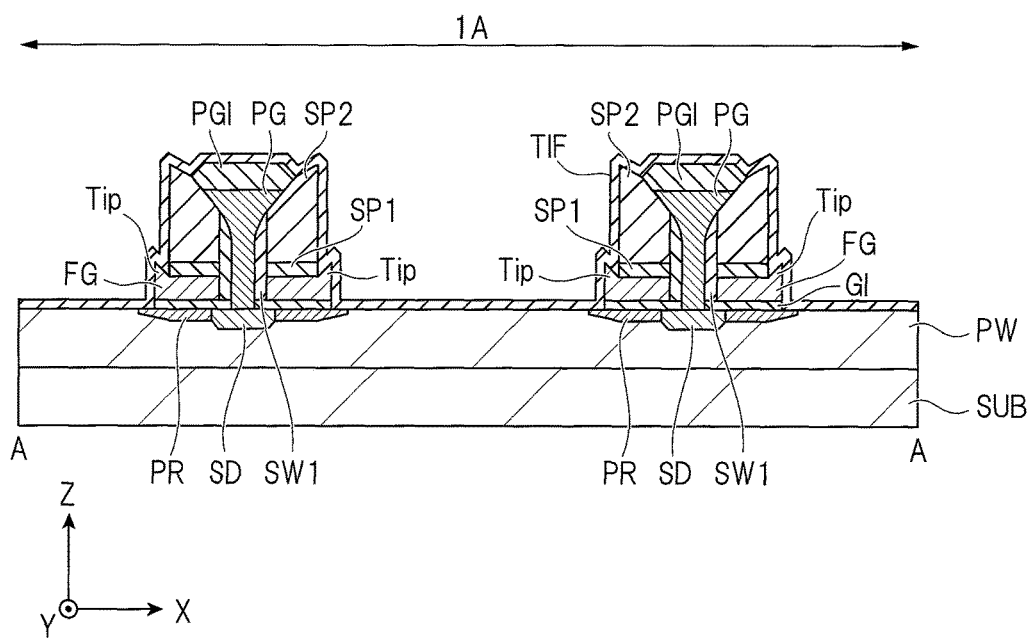
FIG. 25A is a cross-sectional view subsequent to FIG. 24A, illustrating a manufacturing process of the semiconductor device according to the first embodiment.
Figure 25B:
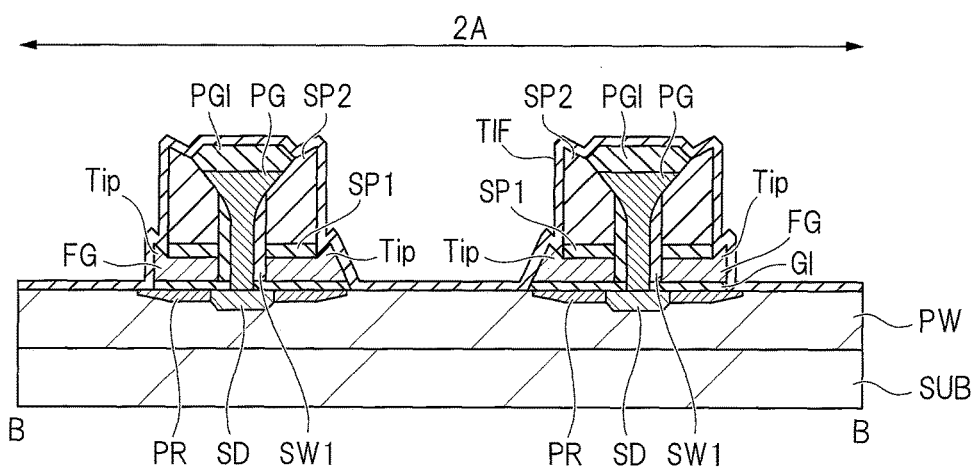
FIG. 25B is a cross-sectional view subsequent to FIG. 24B, illustrating a manufacturing process of the semiconductor device according to the first embodiment.

Next, as illustrated in FIG. 25, a silicon oxide film serving as the tunnel insulating film TIF is formed over the entire surface of the semiconductor substrate SUB by the CVD or the like. Accordingly, the sharped-edged portion Tip and the side surface of the floating gate FG are covered with the tunnel insulating film TIF. This tunnel insulating film TIF plays a role of electrically isolating the floating gate FG and the control gate FG to be formed in the subsequent process. Also, the tunnel insulating film TIF is also formed over the semiconductor substrate SUB (the p-type well PW) and plays a role of electrically isolating the semiconductor substrate SUB (the p-type well PW) and the control gate FG to be formed in the subsequent process.

Figure 26A:
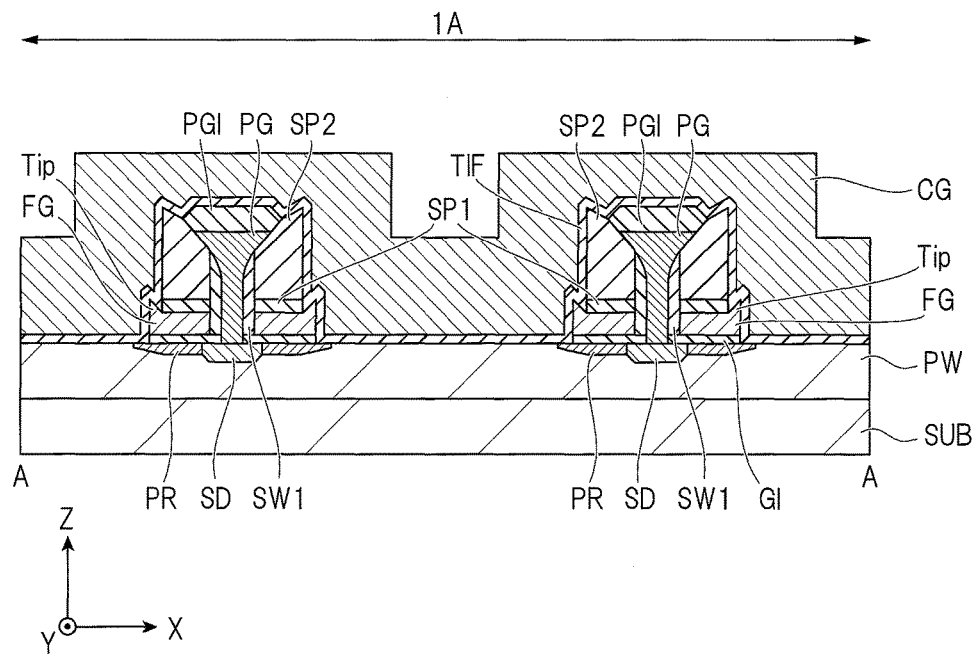
FIG. 26A is a cross-sectional view subsequent to FIG. 25A, illustrating a manufacturing process of the semiconductor device according to the first embodiment.
Figure 26B:
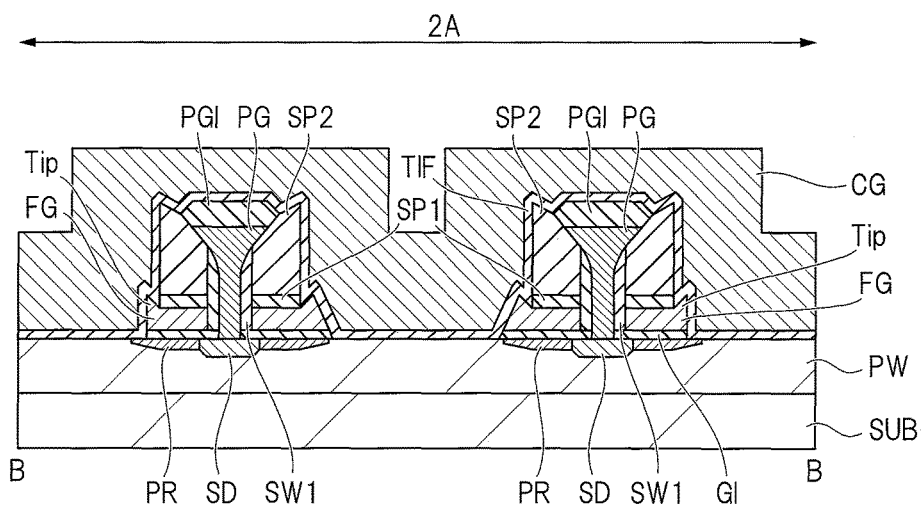
FIG. 26B is a cross-sectional view subsequent to FIG. 25B, illustrating a manufacturing process of the semiconductor device according to the first embodiment.

Next, as illustrated in FIG. 26, a conductive film serving as the control gate CG is formed over the entire surface of the semiconductor substrate SUB. For example, a polysilicon film as the conductive film is formed over the tunnel insulating film TIF by the CVD or the like.

Figure 27A:
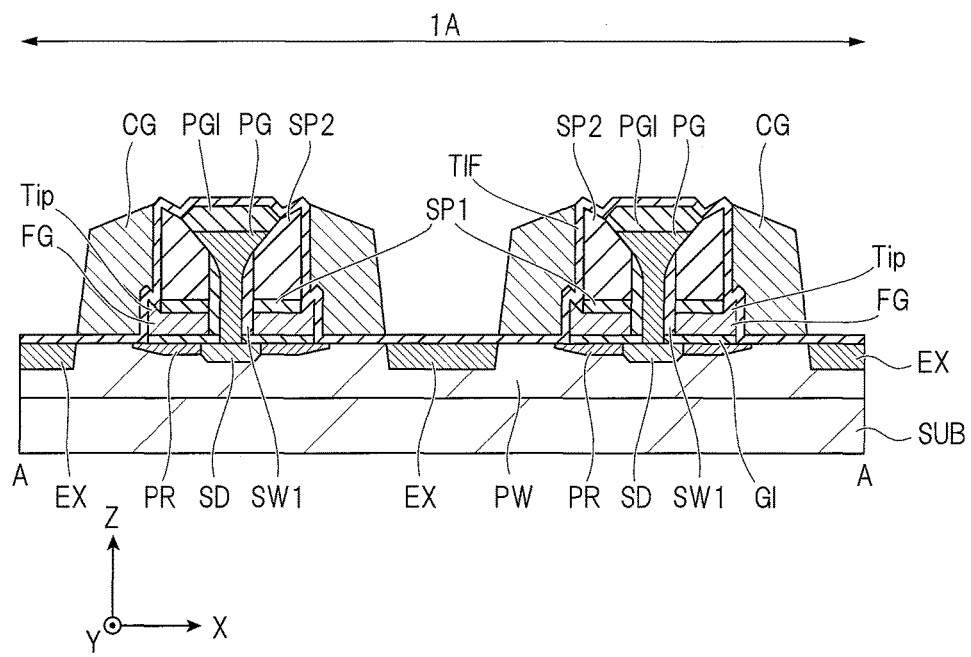
FIG. 27A is a cross-sectional view subsequent to FIG. 26A, illustrating a manufacturing process of the semiconductor device according to the first embodiment.
Figure 27B:
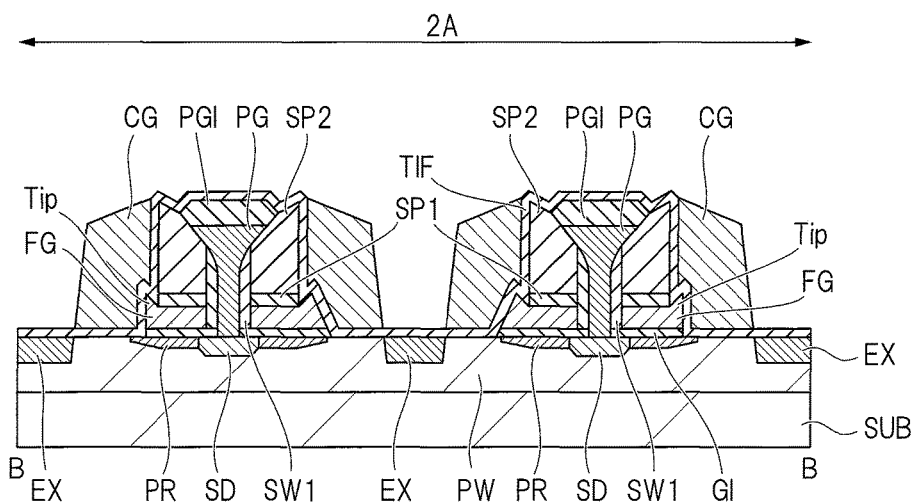
FIG. 27B is a cross-sectional view subsequent to FIG. 26B, illustrating a manufacturing process of the semiconductor device according to the first embodiment.

Next, as illustrated in FIG. 27, the polysilicon film (CG) is etched back. In this etch-back process, the polysilicon film is removed from the front surface thereof by a predetermined film thickness by anisotropic dry etching. In this process, the control gate CG in a sidewall shape can be formed on the sidewall of the floating gate FG and the spacer insulating film (SP1 and SP2). When viewed differently, a pair of control gates CG can be formed between a pair of floating gates FG (two floating gates FG inside a pair of plugs PG).

Then, a low concentration semiconductor region ($n^-$-type semiconductor region) EX is formed in the semiconductor substrate SUB (p-type well PW) between the control gates CG (for example, between the pair of control gates CG) by ion implantation of n-type impurity (for example, arsenic (As) or phosphorus (P)).

Figure 28A:
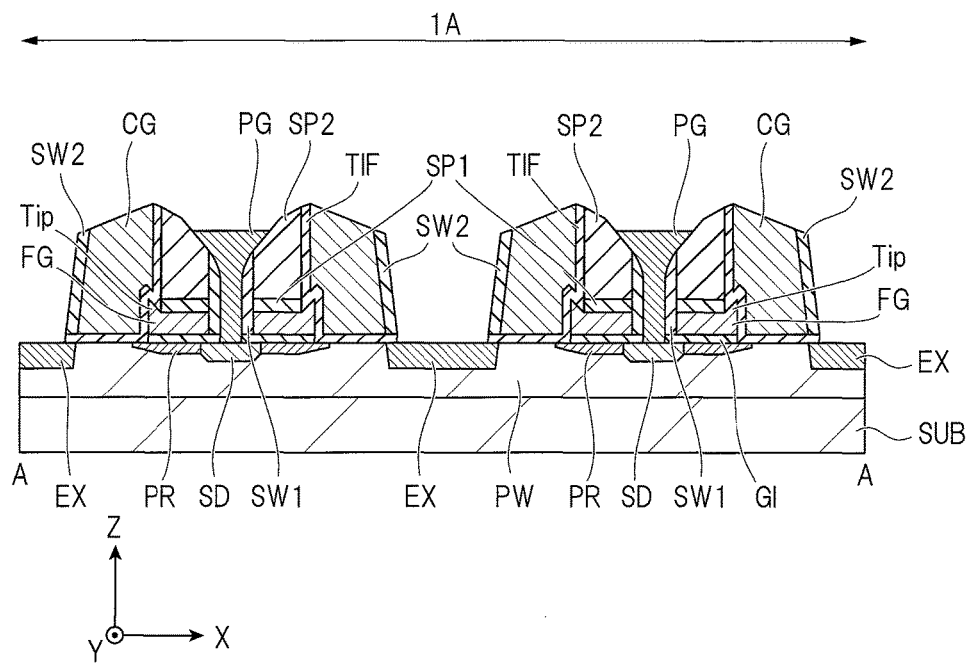
FIG. 28A is a cross-sectional view subsequent to FIG. 27A, illustrating a manufacturing process of the semiconductor device according to the first embodiment.
Figure 28B:
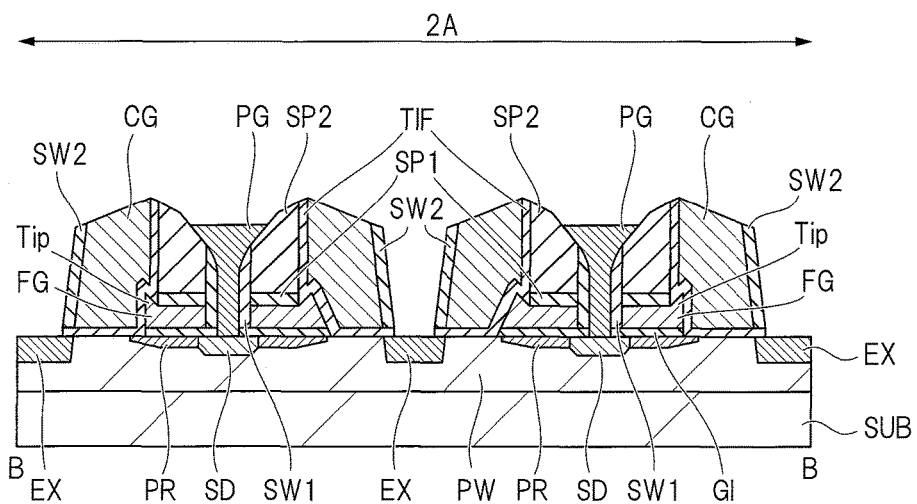
FIG. 28B is a cross-sectional view subsequent to FIG. 27B, illustrating a manufacturing process of the semiconductor device according to the first embodiment.

Next, as illustrated in FIG. 28, a silicon oxide film serving as the sidewall insulating film SW2 is formed over the entire surface of the semiconductor substrate SUB by the CVD or the like and etched back. In this etch-back process, the sidewall insulating film SW2 is formed on the sidewall of the control gate CG. The height of the sidewall insulating film SW2 is substantially 1600 angstroms, for example. Thus, since the spacer SP2 has the sufficient height and the height of the control gate CG corresponds to that of the spacer SP2, the sufficient height of the control gate CG is also secured, and as a result, the sufficient height of the sidewall insulating film SW2 formed on the sidewall of the control gate CG can be secured.

Also, in this etch-back process, the exposed tunnel insulating film TIF (the tunnel insulating film TIF on the plug PG and the spacer SP2) and the plug insulating film PGI in FIG. 27 are removed.

Figure 29A:
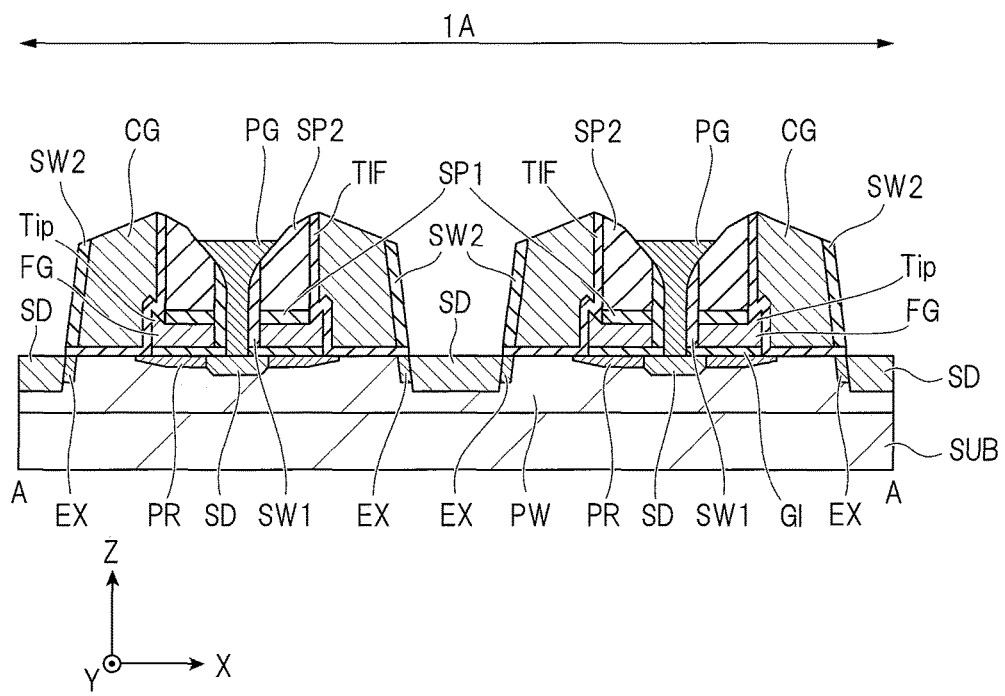
FIG. 29A is a cross-sectional view subsequent to FIG. 28A, illustrating a manufacturing process of the semiconductor device according to the first embodiment.
Figure 29B:
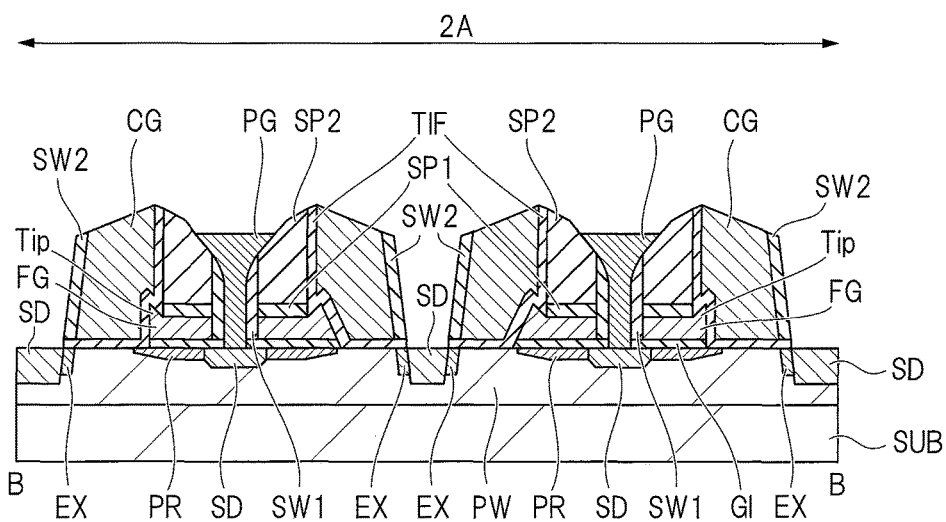
FIG. 29B is a cross-sectional view subsequent to FIG. 28B, illustrating a manufacturing process of the semiconductor device according to the first embodiment.

Next, as illustrated in FIG. 29, the source and drain region (n$^+$-type semiconductor region or high concentration semiconductor region) SD is formed in the semiconductor substrate SUB (p-type well PW) between the sidewall insulating films SW2 (for example, between the respective sidewall insulating films SW2 of the pair of the control gates CG) by ion implantation of n-type impurity (for example, arsenic (As) or phosphorus (P)). This source and drain region SD serves as the source and drain region SD on the side of the control gate CG.

Then, a metal silicide film SIL is formed on the control gate CG and the source and drain region SD through use of the salicide technique (see FIGS. 1 and 3).

For example, a metal film (not illustrated) is formed over the entire surface of the semiconductor substrate SUB, and the semiconductor substrate SUB is subjected to heat treatment, so that each of the control gate CG and the source and drain region SD reacts with the metal film. Accordingly, the metal silicide film SIL is formed. The metal film can be formed by sputtering. In this case, as described above, since the sufficient height of the sidewall insulating film SW2 is secured, it is possible to prevent short-circuiting between the metal silicide film SIL on the control gate CG and the metal silicide film SIL on the source and drain region SD. Then, unreacted metal film is removed. With this metal silicide film SIL, it is possible to lower diffusion resistance and contact resistance.

By the above processes, the semiconductor device according to the present embodiment can be formed. Specifically, in the above processes, upon forming a plurality of component portions in the memory cell, there are few portions to be formed by the photolithography process and many portions to be formed in a self-aligned manner by etching back. Accordingly, manufacturing the semiconductor device becomes easy, and reduction in a cell size is achieved.

Second Embodiment

Although the monitor pattern (FIG. 3) has the same configuration as the memory cell (FIG. 1) in the first embodiment, it is not required to form the source and drain region SD, the control gate CG, and the plug PG in the monitor pattern (FIG. 3).

It is sufficient if the monitor pattern (FIG. 3) has at least the floating gate FG and the spacer insulating film (SP1 and SP2). Thus, the component portions of the monitor pattern do not have to include all component portions of the memory cell. In this sense, the component portions of the monitor pattern can be said to be a dummy pattern which does not perform memory cell operation.

Figure 23A:
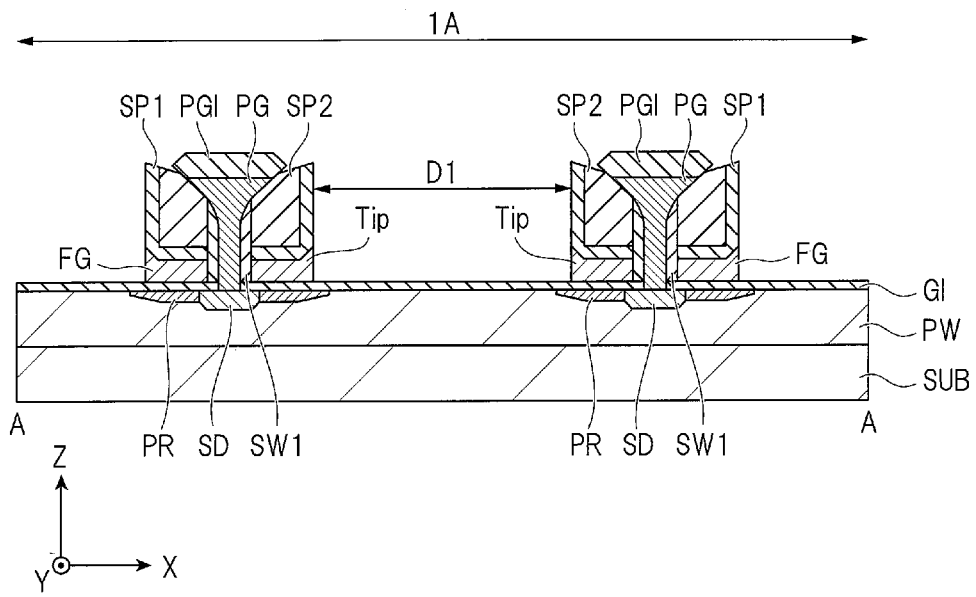
FIG. 23A is a cross-sectional view subsequent to FIG. 22A, illustrating a manufacturing process of the semiconductor device according to the first embodiment.
Figure 23B:
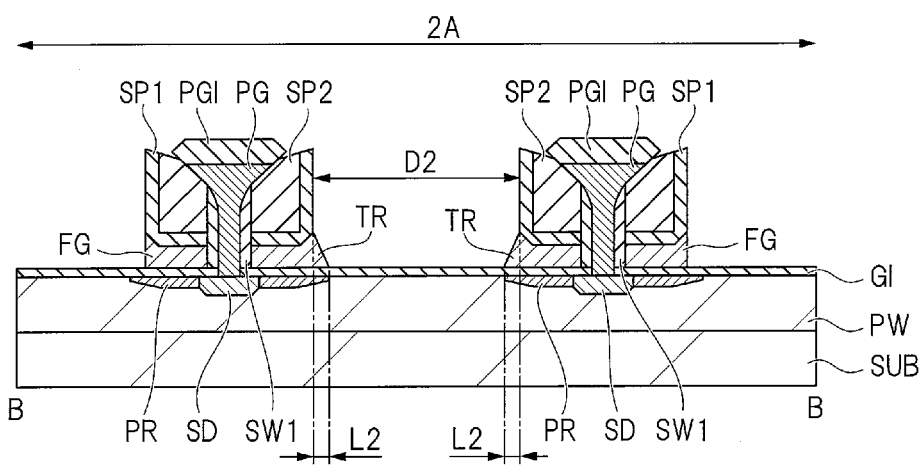
FIG. 23B is a cross-sectional view subsequent to FIG. 22B, illustrating a manufacturing process of the semiconductor device according to the first embodiment.
Figure 24B:
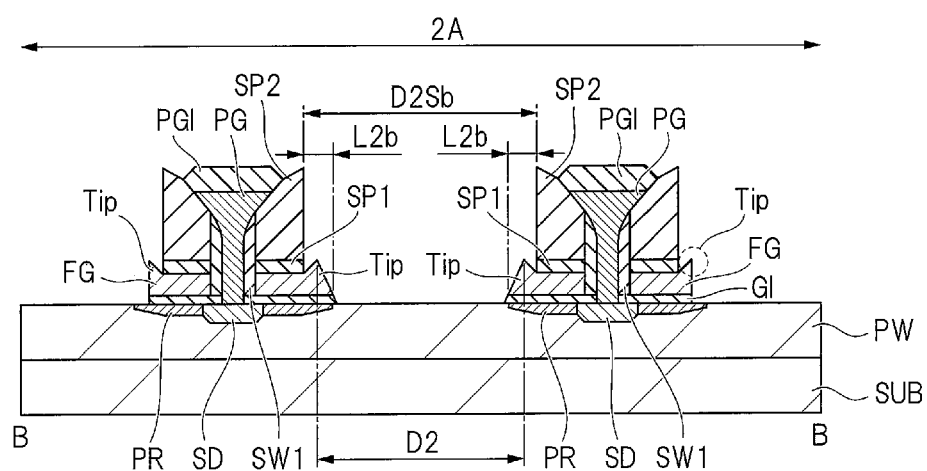
FIG. 24B is a cross-sectional view subsequent to FIG. 23B, illustrating a manufacturing process of the semiconductor device according to the first embodiment.

For example, in the monitor pattern (FIG. 3), it is sufficient if the floating gate FG and the spacer insulating film (SP1 and SP2) illustrated in FIG. 23B and FIG. 24B are included. Accordingly, the processes of forming the p-type well PW, the source and drain region SD on the side of the floating gate FG, and the p-type semiconductor region PR which has been formed in the stage of FIG. 23B may be omitted. Note that, although the plug PG illustrated in FIG. 23B and FIG. 24B is not essential to the monitor pattern, when the plug PG is incorporated into the monitor pattern, the shape of the floating gate FG and the spacer insulating film (SP1 and SP2) is stabilized, so that a monitoring accuracy is improved. Moreover, the processes of forming the tunnel insulating film TIF, the control gate CG, and the source and drain region SD (including the low concentration semiconductor region EX) on the side of the control gate CG which are formed in the processes subsequent to FIG. 23B may be omitted.

Third Embodiment

In the first embodiment (FIGS. 1 and 3), although the side surfaces of the spacers SP1 and SP2 are substantially vertical to the front surface of the semiconductor substrate SUB, the side surfaces of the spacers SP1 and SP2 may have a tapered shape, in some cases. For example, a taper angle θ of the side surface of the spacer insulating film (SP1 and SP2) is, for example, 90° to 88°. The taper angle θ is an angle formed by the front surface of the semiconductor substrate SUB and the side surface of the spacer SP1 (or SP2) (see FIG. 30).

The reason that the side surface of the spacer SP1 may have a tapered shape will be described. As illustrated in FIGS. 14 and 15 of the first embodiment, the spacer SP1 is formed along the side surface of the sacrificial film HM1. Since the sacrificial film HM1 is formed to be relatively thick (for example, having a film thickness of 3500 to 4000 angstroms), the side surface thereof tends to have a tapered shape by etching. Accordingly, the side surface of the spacer SP1 corresponds to the side surface of the sacrificial film HM1 to have a tapered shape. In other words, the side surface of the spacer SP1 on the side of the control gate CG inclines to the side of the tapered portion TR. Also, since the side surface of the spacer SP2 is also formed to correspond to the side surface of the spacer SP1, even after the spacer SP1 on the side surface of the spacer SP2 is removed and the side surface of the spacer SP2 is exposed, the side surface of the spacer SP2 has a tapered shape.

Specifically, the plug and the spacer insulating film (SP1 and SP2) which are formed on one side of the floating gate FG function as the insulating film between the control gate CG and the plug PG. Further, when the metal silicide film SIL is formed on the upper portion of each of the plug PG and the control gate CG, it is required to secure a high and thick spacer insulating film (SP1 and SP2) in order to prevent short-circuiting between the metal silicide films SIL. Accordingly, the sacrificial film HM1 has to be thick to some extent, and the opening thereof tends to have a tapered shape.

Figure 30A:
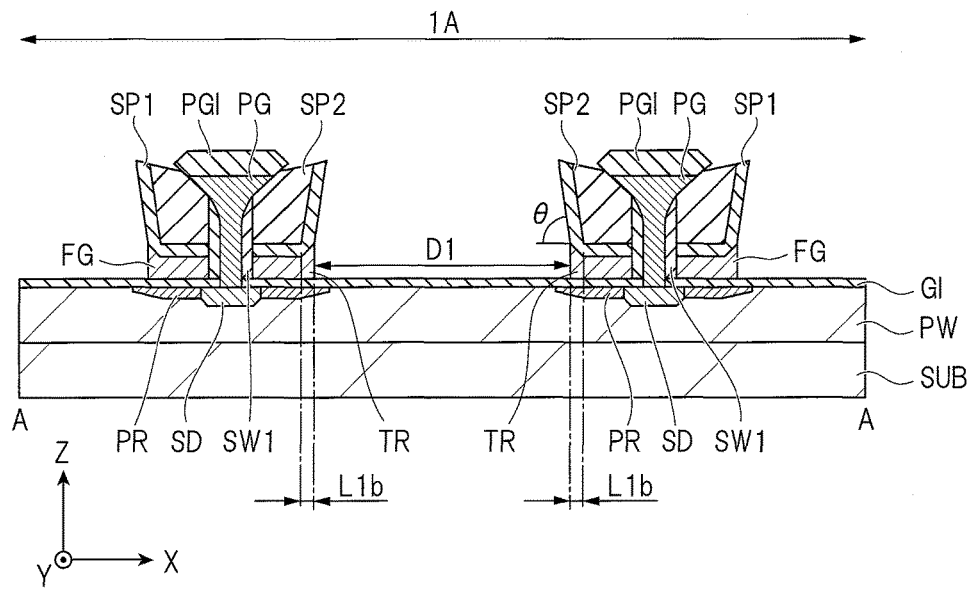
FIG. 30A is a cross-sectional view of the memory region of the semiconductor device according to a third embodiment.
Figure 30B:
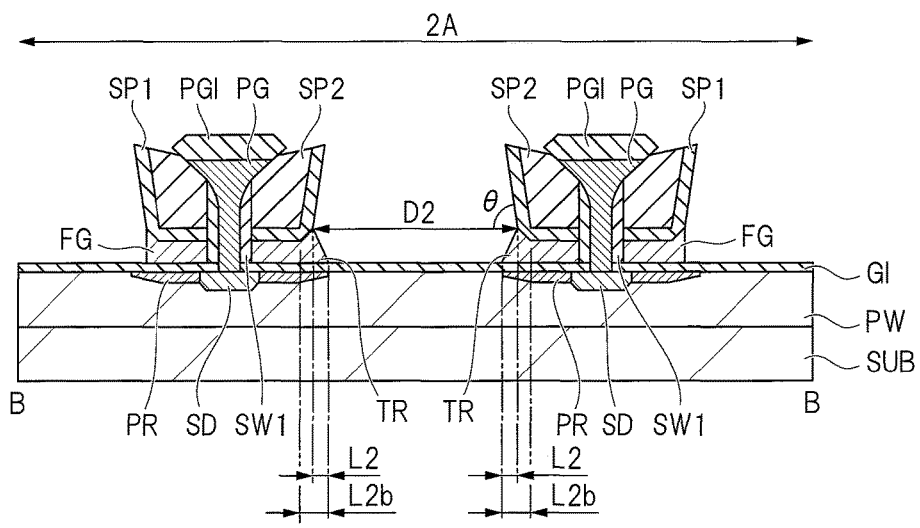
FIG. 30B is a cross-sectional view of the monitor region of the semiconductor device according to the third embodiment.

Thus, when the side surface of the spacer SP1 has a tapered shape, as illustrated in FIG. 30, the side surface of the spacer SP1 protrudes much more outwardly than that of the floating gate FG. FIG. 30 is a partial cross-sectional view of the semiconductor device according to the present embodiment.

Thus, when the side surface of the spacer SP1 protrudes so as to cover the side surface of the floating gate FG, the checking of the shape of the floating gate FG of the memory cell from above becomes more difficult.

Thus, when the taper angle θ of each side surface of the spacers SP1 and SP2 is 90° or less, the checking of the shape of the floating gate FG of the memory cell in the monitor pattern is particularly effective. That is, by narrowing the distance (distance D2) between the floating gates FG in the monitor region 2A, the tapered portion TR is provided on the side surface of the floating gate FG to check this tapered portion TR and the protruding amounts (L1, L2, L1b, and L2b). Such processes of understanding the shape of the floating gate FG in the memory region 1A are particularly effective.

Note that, although the state in which the spacer SP1 remains on the sidewall of the spacer SP2 is described in FIG. 30, the checking of the tapered portion TR of the floating gate FG in the monitor region 2A may be carried out with the spacer SP1 on the sidewall of the spacer SP2 removed.

Fourth Embodiment

Although the reason that the plug PG is preferably incorporated into the monitor pattern has been described in the second embodiment, the monitor pattern without the plug PG may be designed by devising a layout of the monitor pattern and removing the forming region of the plug PG from the monitor pattern.

The semiconductor device of the present embodiment includes the memory region 1A in which the memory cell having the floating gate is formed and the monitor region 2A in which the monitor pattern having the floating gate is formed.

Figure 31A:
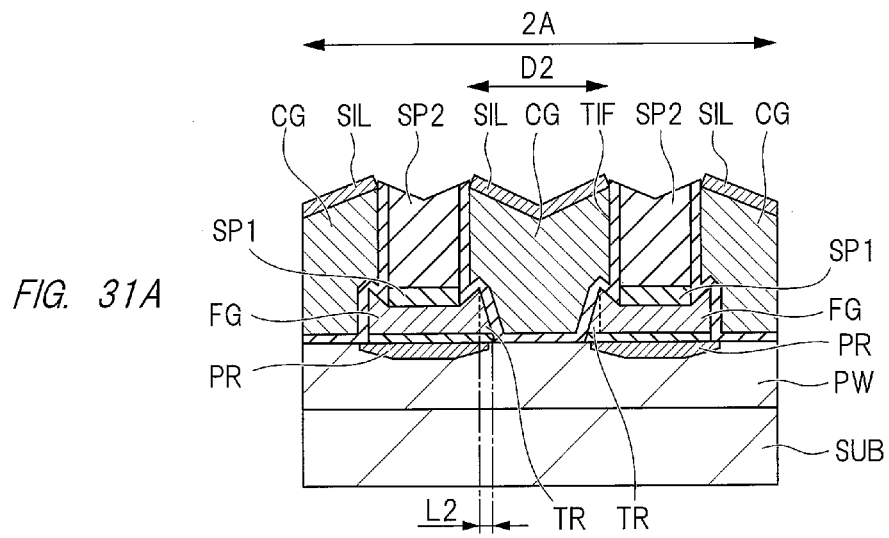
FIG. 31A is a cross-sectional view of the monitor region of the semiconductor device according to a fourth embodiment.
Figure 31B:
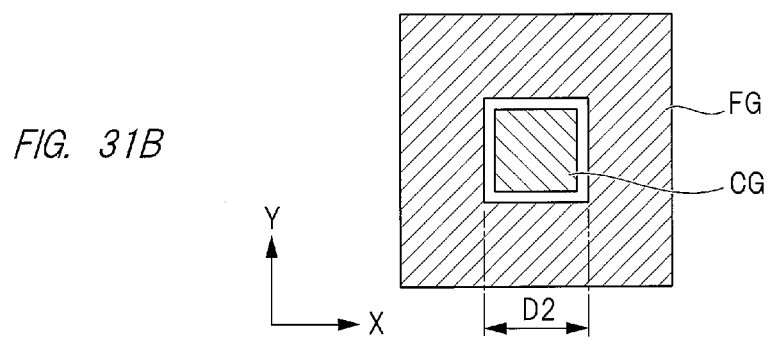
FIG. 31B is a plan view of the monitor region of the semiconductor device according to the fourth embodiment.
Figure 32:
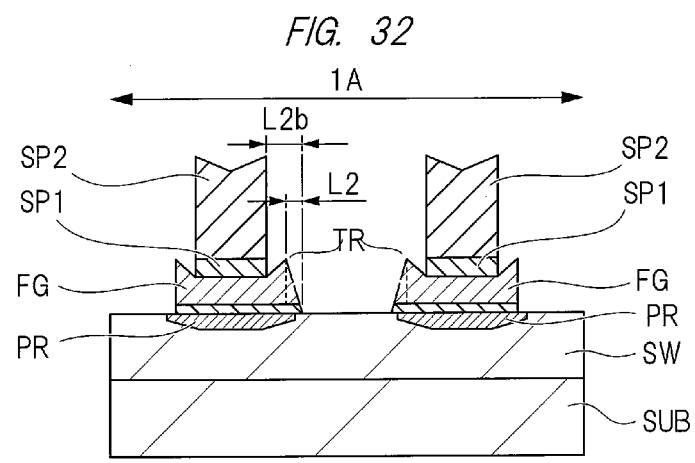
FIG. 32 is a cross-sectional view illustrating a manufacturing process of the semiconductor device according to the fourth embodiment.

FIG. 31A is a cross-sectional view of the monitor region of the semiconductor device according to the present embodiment, and FIG. 31B is a plan view of the monitor region of the semiconductor device according to the present embodiment. FIG. 32 is a cross-sectional view illustrating a manufacturing process of the semiconductor device according to the present embodiment.

As illustrated in FIG. 31B, the floating gate FG is provided in a ring shape, and the control gate CG inside the floating gate FG is not in a ring shape, but in a square shape, which is different from the first embodiment (see FIG. 4).

Also in this case, the distance (distance D2) between the floating gates FG in the monitor region 2A, that is, the distance between the floating gate portions FGa and FGb, is smaller than the distance (distance D1, see FIG. 1) between the floating gates FG in the memory region 1A, and accordingly, the tapered portion TR can be provided on the side surface of the floating gate FG. As a result, similarly to the first embodiment, by checking the tapered portion TR and the protruding amounts (L1, L2, L1b, and L2b), it is possible to understand the shape of the floating gate FG in the memory region 1A (see FIG. 32).

For example, the distance (distance D2) between the floating gates FG in the monitor region 2A is ½ or less of the distance (distance D1) between the floating gates FG in the memory region 1A. Thus, by reducing the size of the monitor pattern, the monitor region 2A can be downsized. Accordingly, a layout of the TEG can be optimized, for example.

Note that, although the state in which the spacer SP1 on the sidewall of the spacer SP2 is removed is described in FIG. 32, the checking of the tapered portion TR of the floating gate FG in the monitor region 2A may be carried out with the spacer SP1 remaining on the sidewall of the spacer SP2.

Also, in FIG. 31A, although the p-type well PW and the p-type semiconductor region PR are formed, they may be omitted. Also, the tunnel insulating film TIF, the control gate CG, and the like may be omitted.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A method of manufacturing a semiconductor device comprising:
    (a) forming a conductive film above a semiconductor substrate in a first region and in a second region, respectively;
    (b) forming a pair of first spacer insulating films disposed on the conductive film in the first region to be spaced apart from each other by a first distance, and forming a pair of second spacer insulating films disposed on the conductive film in the second region to be spaced apart from each other by a second distance smaller than the first distance, respectively; and
    (c) etching the conductive film using the pair of first spacer insulating films and the pair of second spacer insulating films as a mask, thereby forming a pair of first conductive film portions disposed in the first region via a first spaced portion corresponding to the first distance to be spaced from each other, and forming a pair of second conductive film portions disposed in the second region via a second spaced portion corresponding to the second distance, respectively,
    wherein the first region is the monitoring region, and the second region is the memory region.

2. The method of manufacturing a semiconductor device according to claim 1,
    wherein, in the operation (c), a tapered portion protruding from a side surface portion of the second spacer insulating film is formed at an end of the pair of second conductive film portions on the side of the second spaced portion.

3. The method of manufacturing a semiconductor device according to claim 1,
    wherein, in the operation (c), a first protruding amount by which the second conductive film portion protrudes from the side surface portion of the second spacer insulating film is larger than a second protruding amount by which the first conductive film portion protrudes from a side surface of the first spacer insulating film.

4. The method of manufacturing a semiconductor device according to claim 3, comprising:
    (d) determining whether a shape of the second conductive film portion is good or not based on the first protruding amount and the second protruding amount.

5. A method of manufacturing a semiconductor device, comprising:
    (a) forming a first conductive film above a semiconductor substrate via a first insulating film in a first region and in a second region, respectively;

(b) forming a first sacrificial film on the first conductive film in the first region, the first sacrificial film having a width in a first direction which corresponds to a first distance, and forming a second sacrificial film on the first conductive film in the second region, the second sacrificial film having a width in the first direction which corresponds to a second distance which is smaller than the first distance, respectively;

(c) forming a pair of first spacer insulating films on opposite ends of the first sacrificial film, and forming a pair of second spacer insulating films on opposite ends of the second sacrificial film, respectively;

(d) forming a first source and drain region in the semiconductor substrate outside the first sacrificial film and the pair of first spacer insulating films;

(e) removing the first sacrificial film and the second sacrificial film, respectively;

(f) etching the first conductive film using the pair of first spacer insulating films and the pair of second spacer insulating films as a mask, thereby forming a pair of first conductive film portions disposed in the first region via a first spaced portion corresponding to the first distance, and forming a pair of second conductive film portions disposed in the second region via a second spaced portion corresponding to the second distance, respectively;

(g) etching the first conductive film using the pair of first spacer insulating films and the pair of second spacer insulating films as a mask, thereby forming a pair of first gate electrode portions in the first region, and forming a pair of second gate electrode portions in the second region, respectively;

(h) forming a second conductive film in the first region via a second insulating film;

(i) etching the second conductive film, thereby forming a pair of third gate electrode portions between the pair of first gate electrode portions; and (j) forming a second source and drain region in the semiconductor substrate between the pair of third gate electrode portions, wherein the pair of second gate electrode portions in the operation (g) is a part of ring-shaped electrode portion, and an outer shape of the ring-shaped electrode portion is a rectangular shape.

6. The method of manufacturing a semiconductor device according to claim 5, wherein the operation (d) includes forming a conductive plug on the first source and drain region after forming the first source and drain region.

7. The method of manufacturing a semiconductor device according to claim 5, wherein, in the operation (g), a tapered portion protruding from a side surface portion of the second spacer insulating film is formed at an end of the second conductive film portion on the side of the second spaced portion.

8. The method of manufacturing a semiconductor device according to claim 5, wherein, in the operation (g), a first protruding amount by which the second conductive film portion protrudes from the side surface portion of the second spacer insulating film is larger than a second protruding amount by which the first conductive film portion protrudes from a side surface portion of the first spacer insulating film.

9. The method of manufacturing a semiconductor device according to claim 8, further comprising:

(k) determining whether a shape of the first gate electrode portion is good or not based on the first protruding amount and the second protruding amount.

10. A method of manufacturing a semiconductor device comprising:

(a) forming a conductive film above a semiconductor substrate in a first region and in a second region, respectively;

(b) forming a pair of first spacer insulating films disposed on the conductive film in the first region to be spaced apart from each other by a first distance, and forming a pair of second spacer insulating films disposed on the conductive film in the second region to be spaced apart from each other by a second distance smaller than the first distance, respectively; and (c) etching the conductive film using the pair of first spacer insulating films and the pair of second spacer insulating films as a mask, thereby forming a pair of first conductive film portions disposed in the first region via a first spaced portion corresponding to the first distance to be spaced from each other, and forming a pair of second conductive film portions disposed in the second region via a second spaced portion corresponding the second distance, respectively, wherein, in the operation (c), a first protruding amount by which the second conductive film portion protrudes from the side surface portion of the second spacer insulating film is larger than a second protruding amount by which the first conductive film portion protrudes from a side surface of the first spacer insulating film, and wherein, in the first protruding amount by which the second conductive film portion protrudes from the side surface portion of the second spacer insulating film is a tapered portion.

* * * * *